United States Patent [19]
Sierk et al.

[11] Patent Number: 5,220,517
[45] Date of Patent: Jun. 15, 1993

[54] PROCESS GAS DISTRIBUTION SYSTEM AND METHOD WITH SUPERVISORY CONTROL

[75] Inventors: Dennis A. Sierk; Ronald R. DuRoss, both of Huntsville; Stephen G. Geist, Union Grove, all of Ala.; Gregory L. Hayes, Fayetteville, Tenn.

[73] Assignee: SCI Systems, Inc., Huntsville, Ala.

[21] Appl. No.: 576,067

[22] Filed: Aug. 31, 1990

[51] Int. Cl.⁵ .................. G05B 23/00; G05B 9/03
[52] U.S. Cl. .................. 364/550; 364/479; 364/571.04; 340/825.06; 340/825.15; 251/129.04
[58] Field of Search .............. 364/550, 510, 500, 138, 364/571.04, 479, 492; 340/825, 825.06, 825.08, 825.15, 825.22, 825.23; 251/129.04, 289

[56] References Cited

U.S. PATENT DOCUMENTS

| | | | |
|---|---|---|---|
| 4,430,959 | 2/1984 | Ebata et al. | 364/500 X |
| 4,573,114 | 2/1986 | Ferguson et al. | 364/138 |
| 4,628,437 | 12/1986 | Poschmann et al. | 364/138 X |
| 4,736,304 | 4/1988 | Doehler | 364/138 X |
| 4,818,993 | 4/1989 | Stöckel | 340/825.06 |
| 4,866,594 | 9/1989 | David et al. | 364/138 |
| 4,989,160 | 1/1991 | Garrett et al. | 364/509 |
| 5,014,211 | 5/1991 | Turner et al. | 364/510 X |

Primary Examiner—Parshotam S. Lall
Assistant Examiner—E. Pipala
Attorney, Agent, or Firm—Gregor N. Neff

[57] ABSTRACT

A plurality of gas flow control units in cabinets are connected to distribute process gas, on demand, to a plurality of utilization locations known as "tool" locations in a semi-conductor manufacturing plant. Each gas flow control unit is connected to a single tool interface controller over a single communications cable. The status and operational characteristics of the individual units are communicated through the tool interface controller to a supervisory control computer by means of polling. Each flow control cabinet has its own data processor, and can be operated alone. Also, the supervisory computer can be used to operate each cabinet, as well as to monitor operations of the system. Gas demand and other signals are communicated from each tool location to the control units through a single cable connected to the interface controller, thus reducing the original wiring cost. Changing the communications path to accompany a change of the tool to which a given conduit in one of the cabinets delivers its gas can be done quickly, in software, with a few keystrokes. Mechanical re-wiring is not needed.

17 Claims, 22 Drawing Sheets

FIG. 18

| (F1) HOME | (F2) CABINET I/O | (F3) TABLE I/O | (F4) MAINT | (F5) PRINT | (F6) (SPARE) | (F7) (SPARE) | (F8) CONFIG | (F9) PARAM SET | (F10) ESC |

| | | |
|---|---|---|
| (F1) HOME | CABINET 907: CHLORINE | |
| (F2) CABINET I/O | AUTOMATIC MODE ^F1 PURGE TO CHANGE CYL A | #1 TOOL 570 #2 TOOL 314 |
| (F3) TABLE I/O | ^F2 PURGE TO CHANGE CYL B ^F3 MAINTENANCE PURGE CYL A ^F4 MAINTENANCE PURGE CYL B | |
| (F4) MAINT | | |
| (F5) PRINT | PGDN GO TO NEXT PAGE LIST PGUP GO TO PREVIOUS LIST | 64.0   75.0 |
| (F6) (SPARE) | | |
| F7 (SPARE) | 0 200 400 600 800 EXHAUST FLOW 480 | 1200 1400 14.0       12.5 35.0 39.0 |
| F8 CONFIG | | |
| (F9) PARAM SET | | |
| (F10) ESC | | |

TABULAR I/O FOR CABINET 901    ARSINE

| VALVES | | OTHER OUTPUTS | INPUTS | |
|---|---|---|---|---|
| CM-CVA | | | | |
| CM-A2 | DM-C3 | EXHAUST | JACKET LEAK A | HIGH FLOW LEG D |
| CM-A3 | DM-C4 | RUPTURE | JACKET LEAK B | |
| CM-A4 | DM-C6 | REG CREEP | JACKET LEAK C | |
| CM-A5 | DM-C7 | JACKET LEAK | JACKET LEAK D | |
| CM-A6 | DM-D3 | HIGH FLOW | HIGH FLOW CYL A | |
| CM-A7 | DM-D4 | LEAK DETECTED | HIGH FLOW CYL B | |
| CM-A8 | DM-D6 | LOCAL ALARM | GAS LEAK | |
| CM-XA | DM-D7 | GAS ON LEG A | LEG A RFG | |
| CM-CVB | LP-A | GAS ON LEG B | LEG B RFG | |
| CM-B2 | LP-B | GAS ON LEG C | LEG C RFG | |
| CM-B3 | DM-A1 | GAS ON LEG D | LEG D RFG | |
| CM-B4 | DM-B1 | | HIGH FLOW LEG A | |
| CM-B5 | DM-C1 | | HIGH FLOW LEG B | |
| | DM-D1 | | HIGH FLOW LEG C | |

| (F1) | (F2) | (F3) | (F4) | (F5) | (F6) | (F7) | (F7) | (F8) | (F9) |
|---|---|---|---|---|---|---|---|---|---|
| HOME | CABINET I/O | TABLE I/O | MAINT | PRINT | (SPARE) | (SPARE) | CONFIG | PARAM SET | ESC |

PROCESS GAS DISTRIBUTION SYSTEM AND METHOD WITH SUPERVISORY CONTROL

FIELD OF THE INVENTION

This invention relates to process gas distribution systems and methods.

BACKGROUND OF THE INVENTION

Systems and methods presently are used for the automatic or semi-automatic control of process gas distribution in semi-conductor manufacturing. One such system and method which is highly advantageous is shown in U.S. patent application Ser. No. 194,828, filed May 17, 1988, now U.S. Pat. No. 4,989,160, which is assigned to the assignee of this patent application. Despite its excellence, further improvements are needed to solve several remaining problems.

Some prior systems provide for remote control at a single computer console of a large number of remote gas flow control units or "cabinets". Each control unit controls the delivery of process gas to one or more locations where the gas is used to make semiconductor devices. These locations are called "tool" locations. Most control units are located relatively far from the tool locations. It is desired to provide communication links between the tool locations and the flow control cabinets and to provide means for monitoring and controlling the units at a central location. The problem is how to do this without excessive cost.

Another problem with prior systems and methods has been caused by the need to re-calibrate transducers in the gas flow control cabinets at periodic intervals. For example, it has been customary to zero-calibrate pressure transducers once every three to six months or so. The process used in the past often has required up to a full day of labor by one worker for each cabinet. This creates relatively high labor costs and shuts the control unit down for a substantial time during which it cannot be used for production.

A further problem has been created by the expansion of the capabilities of each of the gas flow control cabinets so that it can deliver gas to any one or more of several different tool locations upon demand. This has created problems in purging the gas lines of toxic gas for worker safety during local maintenance of the flow control units. If the "flow-through" process is used, where a purge gas such as nitrogen simply is pumped in one direction through the delivery conduit, it must flow through the long conduit from the cabinet to the tool. This is wasteful of expensive gas, and wastes time. Furthermore, sometimes it is not possible to use the flow-through process, in which case maintenance work on the long delivery conduit can be hazardous. The problems, then, are how to achieve safe local purging without incurring excessive costs, and how to purge the long delivery conduit when flow-through purging is not available.

A similar problem in purging the conduits has been created by the addition of means for delivering gas selectively from two different supply tanks and switching back and forth between the two tanks.

Each of the gas flow control cabinets has an exhaust outlet which is connected to an exhaust duct and from which air and gas from the inside of the cabinet is exhausted at a relatively high flow rate in order to avoid the accumulation of toxic gas in the cabinet due to leaks, etc. Flow measurement means are provided to measure the flow rate of the exhaust gas. If the flow rate falls below a pre-determined safe level, an alarm is activated so that the low flow condition can be remedied. Usually, each duct and fan is in place in the plant before the cabinet is installed. If the diameter of the duct is not the same as that of the exhaust outlet, the flow rate measurement will be erroneous. A tedious and expensive firmware program adjustment then is required in order to avoid this source of error. The labor cost and time to do this constitute another problem to be solved.

A further problem in prior gas distribution systems is that sometimes it is necessary to change the association between a tool location and the gas distribution conduits. For example, it may become necessary to supply a given tool with a different gas or mix of gases, and it may be necessary or expedient to change the connection of different gas distribution conduits to the tool. In the past, this has required re-wiring of the electrical connections so that the tool is correctly connected to the proper control unit or units corresponding to the new gas conduit connections. The inventors have recognized that the re-wiring requirement is costly and time-consuming; it increases equipment down-time and reduces productivity.

OBJECTS OF THE INVENTION

In accordance with the foregoing, it is an object of the present invention to provide a process gas distribution system and method which overcome or greatly alleviate the foregoing problems.

In particular, it is an object of the invention to provide such a system and method with simple centralized monitoring and control of a number of widely-spaced gas flow control cabinets and connection of the cabinets to the tools, but without excessive installation, modification and equipment costs. It is an object to provide such a system and method in which each cabinet also is "smart" and can be used for automatic control of gas delivery and other functions independently of one another and independently of the central control computer.

It is another object of the invention to provide such a system and method in which various transducers which convert process gas distribution parameters into electrical signals can be re-calibrated very quickly and at a relatively low cost.

Another object of the invention is to provide means for automatically purging gas flow lines in a multiple-distribution-leg gas distribution control cabinet quickly and easily, without the cost of other purging means.

It is a further object to provide for purging of the gas delivery conduits from the cabinets to the tools when flow-through purging is not available.

A further object of the invention is to provide such a system and method in which multiple gas sources are used alternatingly to provide a continuous source of gas to the tool locations, and to provide rapid, efficient and flexible purging of the gas flow lines used for that purpose.

A further object of the invention is to provide such a system and method in which the error in the exhaust flow measurement caused by the use of an exhaust duct of a different diameter from that of the cabinet exhaust outlet can be corrected quickly and easily.

Still further, it is an object to provide such a system and method in which the electrical communications between the tools and the flow control cabinets can be changed to correspond to gas flow re-routing changes, without the time and cost of re-wiring the communications connections.

SUMMARY OF THE INVENTION

In accordance with the present invention, the foregoing objects are met by the provision of a process gas distribution system and method in which the remote gas control units are connected sequentially to one another and by a single communication cable to a tool interface controller, which also receives signals from various tool locations and communicates them to the respective cabinets.

A supervisory control computer, preferably a simple and relatively inexpensive personal computer, communicates with the tool interface controller to provide monitoring of the operations of the various cabinets and to control the flow of gases to the tools. A separate data processor is provided in each of the cabinets to control its functions independently from the supervisory control computer. Preferably, direct control by use of the data processor in the cabinet will override control from the central supervisory control computer.

The cost of this system is further minimized by the use of the interface unit to enable communications between the tools and the cabinets, instead of separate cables connected from each tool to each of several cabinets, as in some prior systems. The cable and installation costs thus are reduced significantly.

Zero calibration is provided, advantageously, by automatically subjecting each transducer to a reference standard having a known parameter value. A computer routine is used to compute the difference between the ideal output of the transducer and its actual output. That difference, called an "offset", is stored in computer memory. Later, the offset is used to correct each reading of the transducer. Advantageously, components of the system which are used for other purposes also are used to provide a zero reference for each of the transducers. By this means, re-calibration is performed simply and quickly, at a relatively low labor cost and with relatively little downtime.

In accordance with another feature of the invention, the multiple distribution legs of each gas flow control unit, and the delivery conduits to the tools, are purged by the alternating connection of an evacuation source and a source of purge gas to the distribution legs, with a number of such cycles being selectable, and the duration of each of such cycles being selectable. This provides variable and adjustable cost-saving local purging for the multiple distribution legs, and also provides purging of the delivery conduits to the tools when flow-through purging is not possible, thus providing improved safety.

Purging of toxic gas from conduits from plural selectable gas sources also is provided by purge control means similar to that described above for the distribution legs.

In accordance with another feature of the invention, the exhaust duct diameter can be compensated for, if it is different from that of the exhaust outlet from the cabinet, by storing different constants for different outlet duct sizes, and utilizing a computer routine and the stored constants to compute the flow rate. Thus, the measurement corrections are made by means of a few simple keystrokes of the gas cabinet controls.

Another advantageous feature of the invention is the provision of programmable interface means for enabling the control of gas delivery through selected gas distribution conduits. Preferably, communications lines from the tool locations are terminated in a centrally located interface unit. Each tool is identified by a number. The responsiveness of each gas delivery leg to gas demand signals from a given tool is stored in programmable memory, and the association between tool signals and gas delivery legs is stored in computer memory means. A change of the associations can be made by relatively simple software procedures for changing the data stored in memory, thus avoiding expensive re-wiring.

Other objects and advantages of the invention will be set forth in or apparent from the following description and drawings.

BRIEF DESCRIPTION OF THE DRAWINGS

FIG. 6 is also partially schematic in showing the exhaust system in the upper portion of the figure;

GENERAL DESCRIPTION

Figure 1:
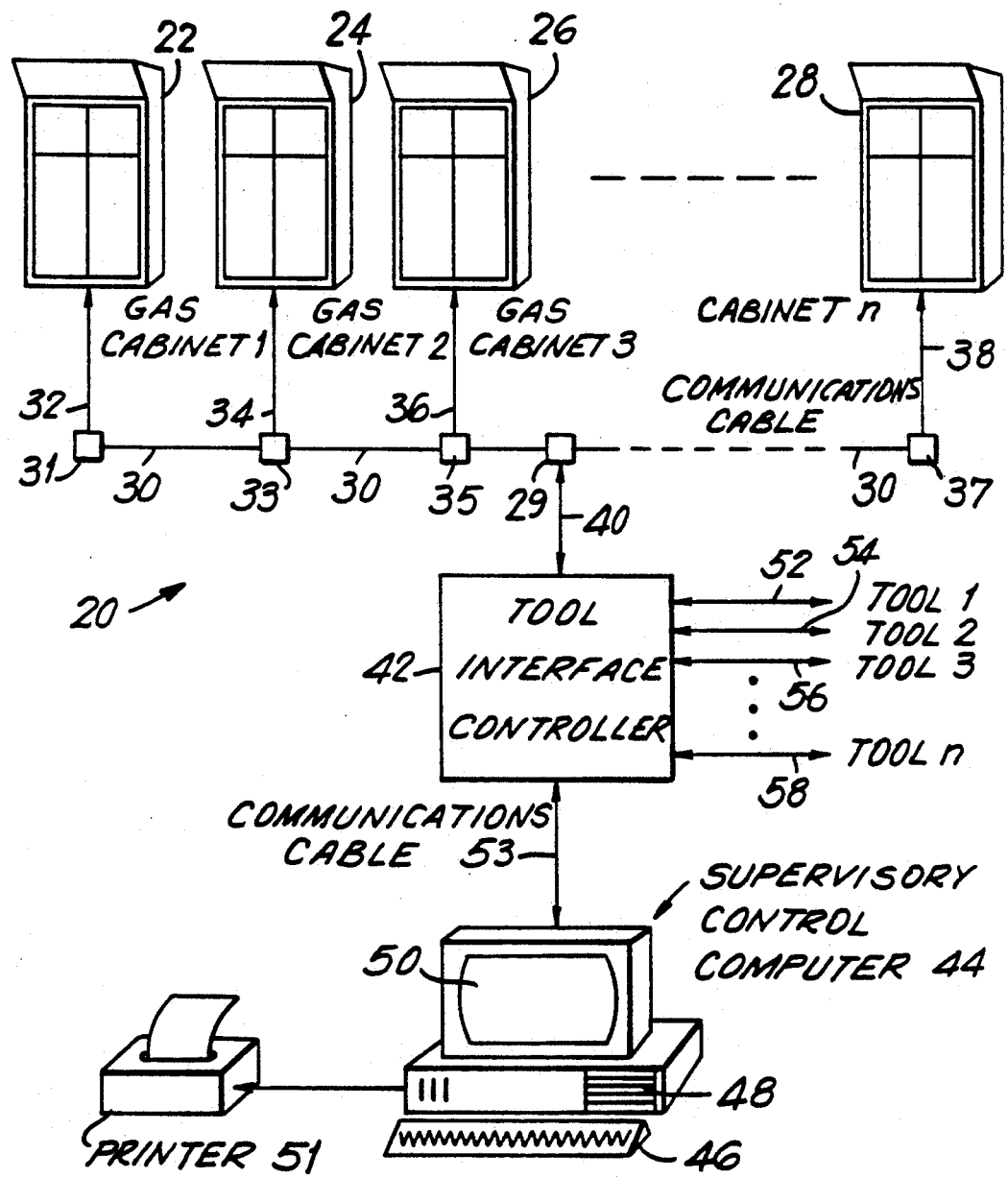
FIG. 1 is a schematic diagram of a process gas distribution system constructed in accordance with the present invention.

FIG. 1 shows a process gas distribution system 20 as it is used in a semi-conductor manufacturing plant. The semiconductors are manufactured using equipment such as diffusion ovens, etc. at various different locations in the plant, each of which is referred to as a "tool" location.

Located in one or more locations remote from the tool locations are a plurality of gas flow control units 22, 24, 26, 28, etc. which are used to store process gases, which often are highly toxic, and to control the distribution of those gases to the various tool locations. Each of the cabinets is "smart"; that is, it contains its own CPU, memory, and other digital and analog interface circuitry, together with its own control panel, to enable it to operate alone, without a remote computer. Each cabinet can be operated separately and independently of every other cabinet, and independently of other equipment in the system. The circuitry of each cabinet is described in some detail below, and in the aforementioned pending U.S. Pat. No. 4,989,160. The disclosure of that patent application hereby is incorporated herein so as to avoid unnecessary duplication of the detailed description given therein.

The control circuitry of each cabinet 22, 24, etc. is connected to the next cabinet by means of a plug-connectable shielded communications cable 30. Each cable 30 is connected to its neighbor and to the circuitry of one cabinets through a plug receptacle 31, 33, 35, 37, etc. All of the cabinets are connected in the same manner so that the cabinets are connected together sequentially in "daisy-chain" fashion. They are connected through a plug receptacle and a communications cable link 40 to a tool interface controller 42.

Tool interface controller 42 is connected by a communications cable 53 to a supervisory control computer 44 which includes a keyboard 46, a disk drive 48, and a video display screen 50, and has a printer 51 connected to it. Advantageously, the supervisory control computer is a relatively inexpensive personal computer such as the IBM PS/2, model 80.

Advantageously, the tool interface controller is connected by the shielded cable 40 to the first cabinet 22 ("cabinet 1"), which is then connected in sequence to cabinets 2, 3 and 4 and as many other cabinets as there are in the system, up to 120 units, as the system presently is configured. Of course, larger or smaller numbers of cabinets can be incorporated in the system. For this reason, the number of the last cabinet in the sequence is cabinet "n".

Additional cabinets can be added into the system simply by plugging in a new cabinet to its nearest neighbor, and re-configuring the system in software. Re-wiring is not needed.

The tool interface controller is adapted to sequentially poll each of the cabinets to send and receive messages to and from each of the cabinets so as to enable monitoring of the cabinet operation at the supervisory control computer 44 and control of the functions of the cabinets from that computer. By the use of this polling technique, the necessity of using separate cables from each of the cabinets to the interface controller 42 is avoided, and a significant cost saving is achieved. Furthermore, since only a relatively low baud rate is used in the communications signal transmissions, the cable can be relatively inexpensive shielded cable rather than the more expensive cable which otherwise might be required.

In accordance with one of the advantageous features of the invention, signals are conducted between the controller 42 and the tools on lines 52, 54, 56, 58 etc. The number of tools which can be connected is relatively large—e.g., up to 120 tools in a system which has been built and successfully tested. Larger numbers are possible.

Figure 2:
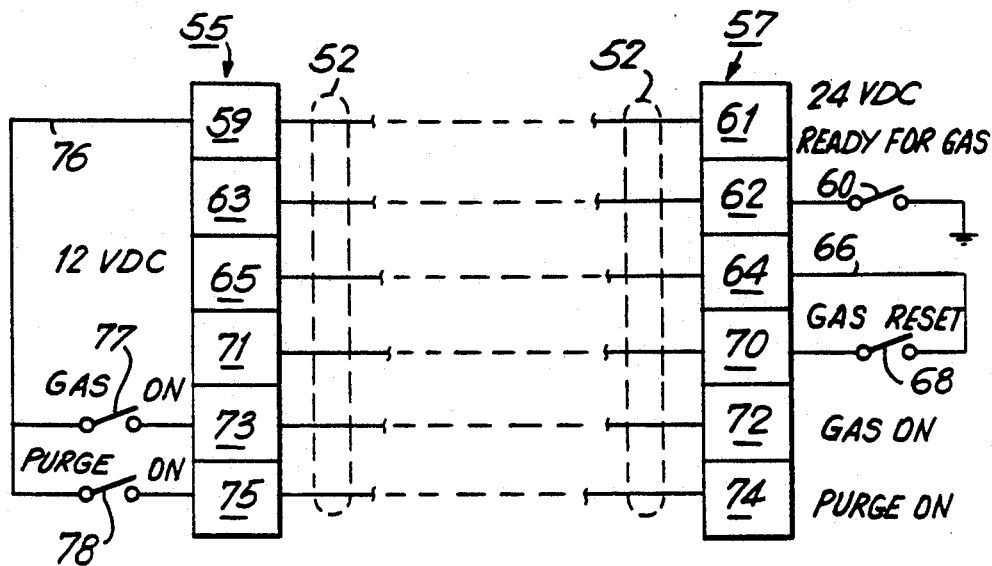
FIG. 2 is a schematic circuit diagram of a connection between the tool interface controller and one of the tool locations shown in FIG. 1.

Turning now to FIG. 2, one of the lines 52 actually is shown to have six separate conductors connected at the controller end to a terminal block 55, and at the tool end to a terminal block 57.

When an operator at a tool location desires to start the flow of process gas to the tool, the operator closes a switch 60 and momentarily closes a gas reset switch 68 to initiate the flow of gas from an appropriate one of the gas cabinets. 24 volts DC is sent from terminal 61 at the tool location to terminal 59 at the controller location over line 76 to enable switches 77 and 78 to operate. Switch 77 closes and lights an indicator lamp 72 at the tool when gas is flowing.

Switch 78 closes to energize an indicator lamp 74 at the tool location to indicate when a purge is in process.

The "ready for gas" and "gas reset" signals sent over terminals 62, 63, 64, 65, and 70 and 71, are delivered by the tool interface controller 42 to the appropriate gas cabinet to cause the opening of various valves to start the gas flow. When the gas flow is to be shut off, the switch 60 is opened, and the controller 42 sends a signal to the gas cabinet and causes it to shut off the gas flow.

ALTERNATIVE TOOL COMMUNICATION

Figure 3:
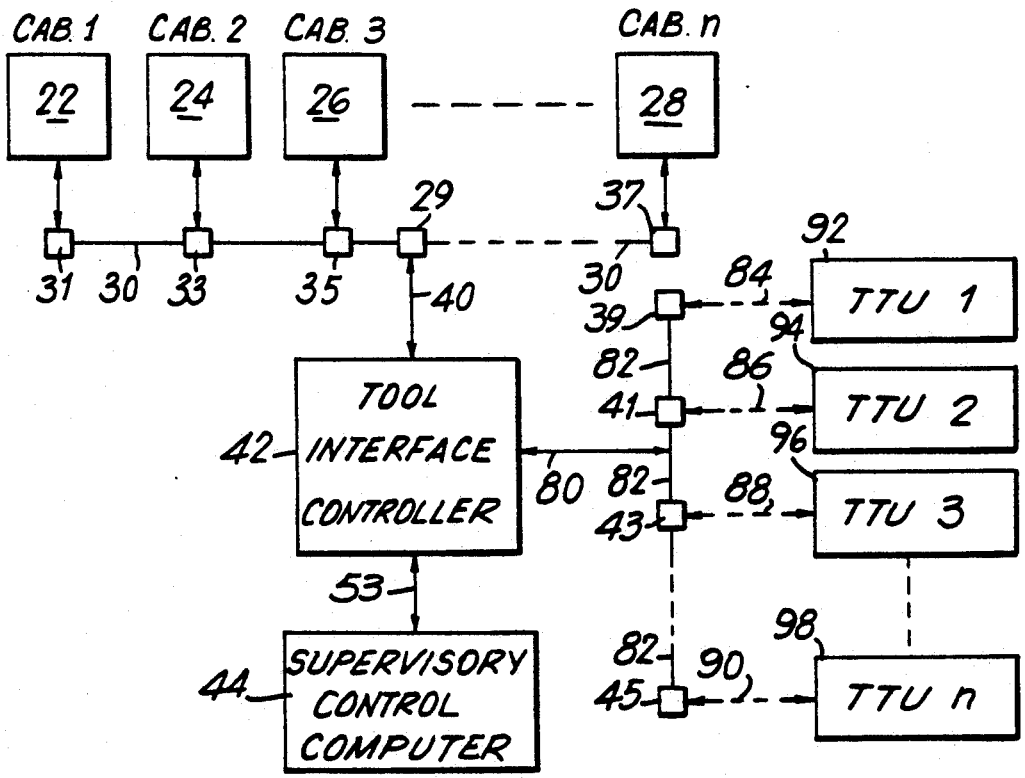
FIG. 3 is a schematic circuit diagram of an alternative embodiment of the system shown in FIG. 1.

FIG. 3 shows an alternative arrangement for communication with each of the tool locations. Instead of a separate six-conductor cable connected from each of the tool locations to the controller 42, a single communications cable 80, like the cable 40, is connected to the controller, and a separate tool termination unit 92, 94, 96, 98, etc. is located at each of the tool locations. Each unit 92, 94, etc. contains its own memory and CPU, such as that provided by a microprocessor, together with programming sufficient to enable it to communicate with the controller 42 in response to polling.

Each of the tool termination units is connected to its neighbor by means of a plug-in connector 39, 41, 43 and 45, etc., through cables 84, 86, 88, 90, etc. and cable section 82 in "daisy-chain" fashion, in the same way that the cabinets 22, 24 etc. are connected together, and all are connected to the interface controller. By this means, a great deal of wiring, labor and materials cost is saved.

Each of the embodiments shown in FIGS. 1-3 gives considerable savings of installation and wiring costs, as well as further savings of re-wiring costs when the tools are later connected to receive gas from different cabinets. For example, in one typical prior system, if four different gases are delivered to a single tool, each from a separate cabinet, four different cables are used to connect the tool electrically directly to the four cabinets. With the embodiment of FIGS. 1-2, only one cable from each tool to the TIC is used, and in the FIG. 3 embodiment, only one cable is used for all tools.

Further saving are gained by both embodiments in avoiding the cost of re-wiring the tools to the cabinets when the association of a tool with the cabinets is changed.

CABINET CIRCUITRY AND CONTROLLER DETAILS

Figure 4:
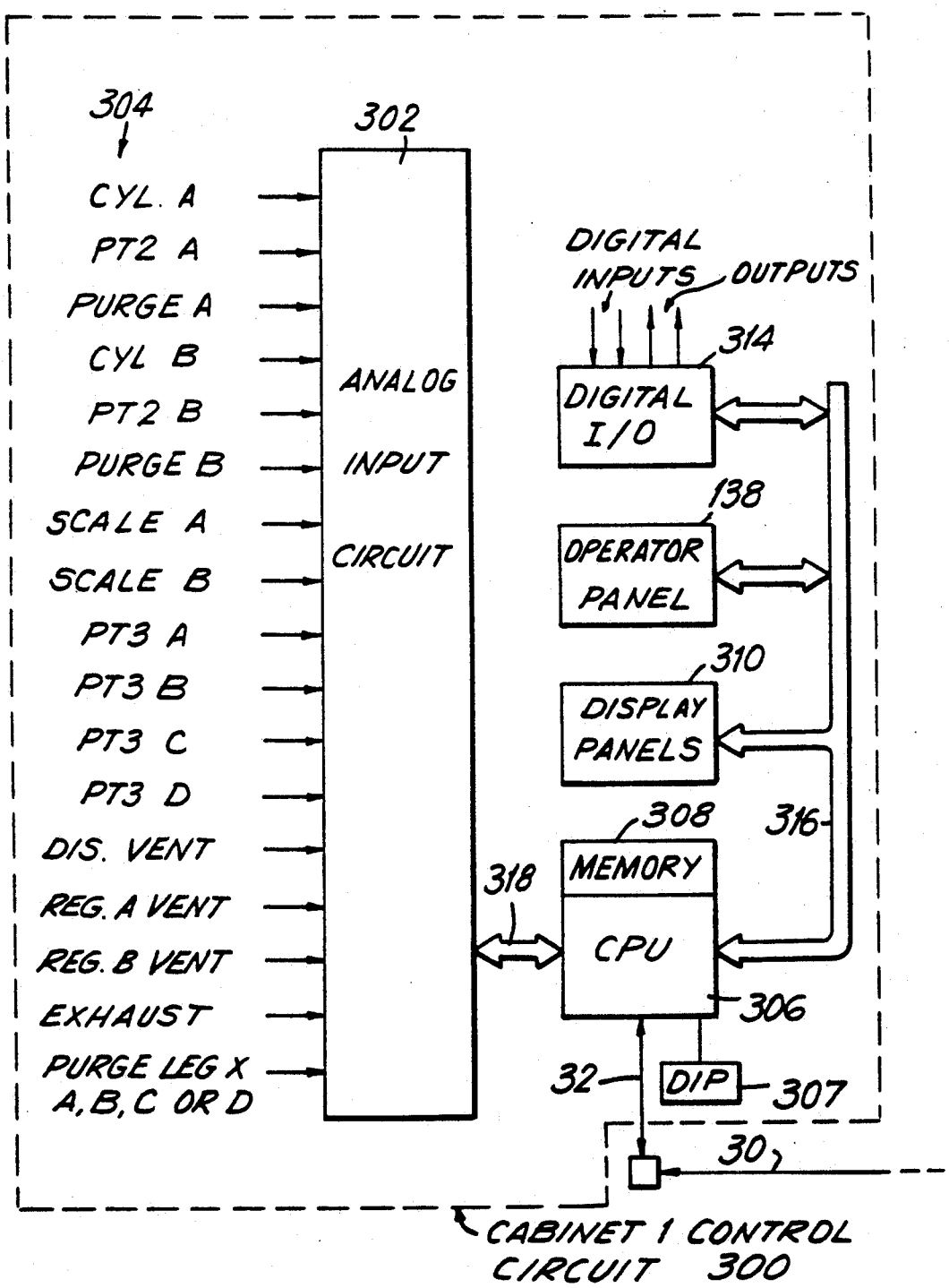
FIG. 4 is a schematic circuit diagram of a portion of the system shown in FIG. 1, showing in some detail the electrical components of the tool interface controller and one of the gas flow control cabinets of FIG. 1.
Figure 4:
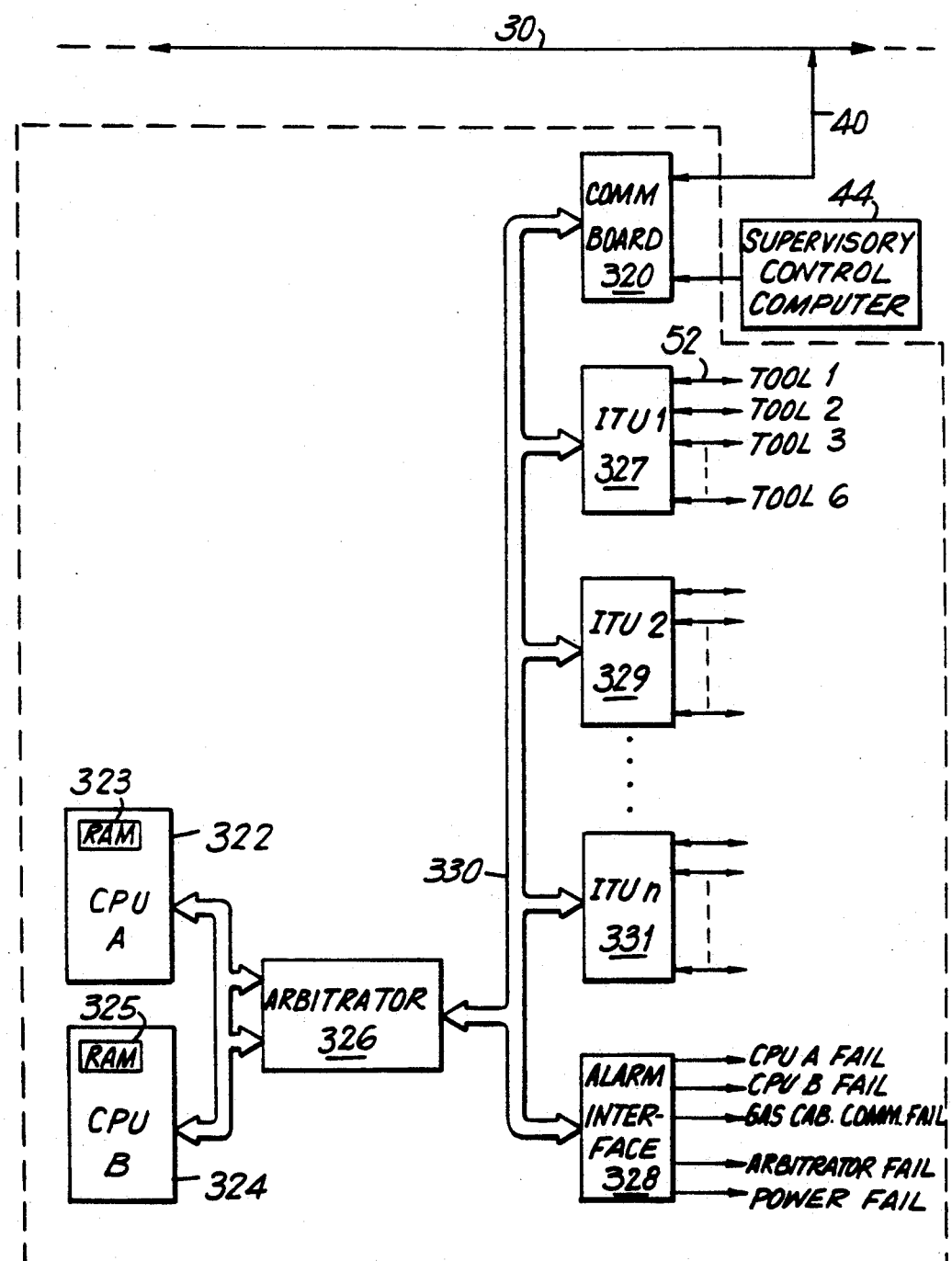

FIG. 4 is a schematic circuit diagram of the control circuit 300 for a single gas flow control unit or cabinet, and shows some of the details of the controller 42. The controller 42 communicates with the gas cabinets and the supervisory computer 44 through a standard communications board 320.

The controller 42 is the sole connection between the tool locations and the gas flow control cabinets. Therefore, it is important that it be as fail-safe as possible. To this end, a certain amount of redundancy is provided. Instead of one, there are two CPUs; a first CPU 322 and a second CPU 324, each of which has a random-access memory ("RAM") 323 or 325.

An arbitrator circuit 326 is provided to determine when one of the CPUs is not operating and automatically switch in the other CPU. Alarms 328 are provided to indicate if either or both of the CPUs is inoperative; to indicate if the arbitrator circuit 326 is inoperative; to indicate whether power is not being supplied to the controller; to determine whether the communication link 40 is not operating, etc., all in order to maximize chances that the terminal controller is operating at substantially all times, or that an alarm will call attention to any problems so they can be corrected quickly. The construction and operation of the arbitrator circuit and its control of the CPUs is conventional and will not be described further herein.

The controller 42 also has several interface terminal units ("ITU") 327, 329, 331, etc, to which the tool cables 52, 54, 56, 58, etc. are connected. The number of ITU's used depends on the number of tools in the system. Each tool and its cable is identified by the simple expedient of connecting it to a single terminal in one of the ITUs, and giving each terminal (and thus, each tool) an identifying number. Each ITU comprises a circuit board with six connection terminals, each terminal connected to a specific tool.

The ITU arrangement is modular. The number of ITU units can be changed easily to accommodate a greater or lesser number of tools in a system.

As it will be described below in greater detail, when the start or stop of gas flow is requested by signals from the tool location, the interface controller broadcasts the signals to the gas flow control cabinets, and each cabinet which controls gas conduits connected to the tool recognizes the tool number and starts or stops the flow of gas to the tool.

In the embodiment of the invention shown in FIG. 3, each tool is identified by a uniquely coded signal which is transmitted to the tool interface controller 42 periodically, by polling, along with gas flow start and stop signals, and is broadcast to the cabinets.

The cabinet control circuit 300 shown in the upper left-hand portion of FIG. 4 includes an analog input circuit 302, which receives analog inputs on lines 304 from various transducers and other sources and amplifies those signals and converts them from analog to digital signals. It delivers the digital signals over a bus 318 to a CPU 306 which has a memory 308. The memory 308 contains both volatile RAM storage chips, as well as electrically erasable programmable read-only memory ("EEPROM").

Figure 6:
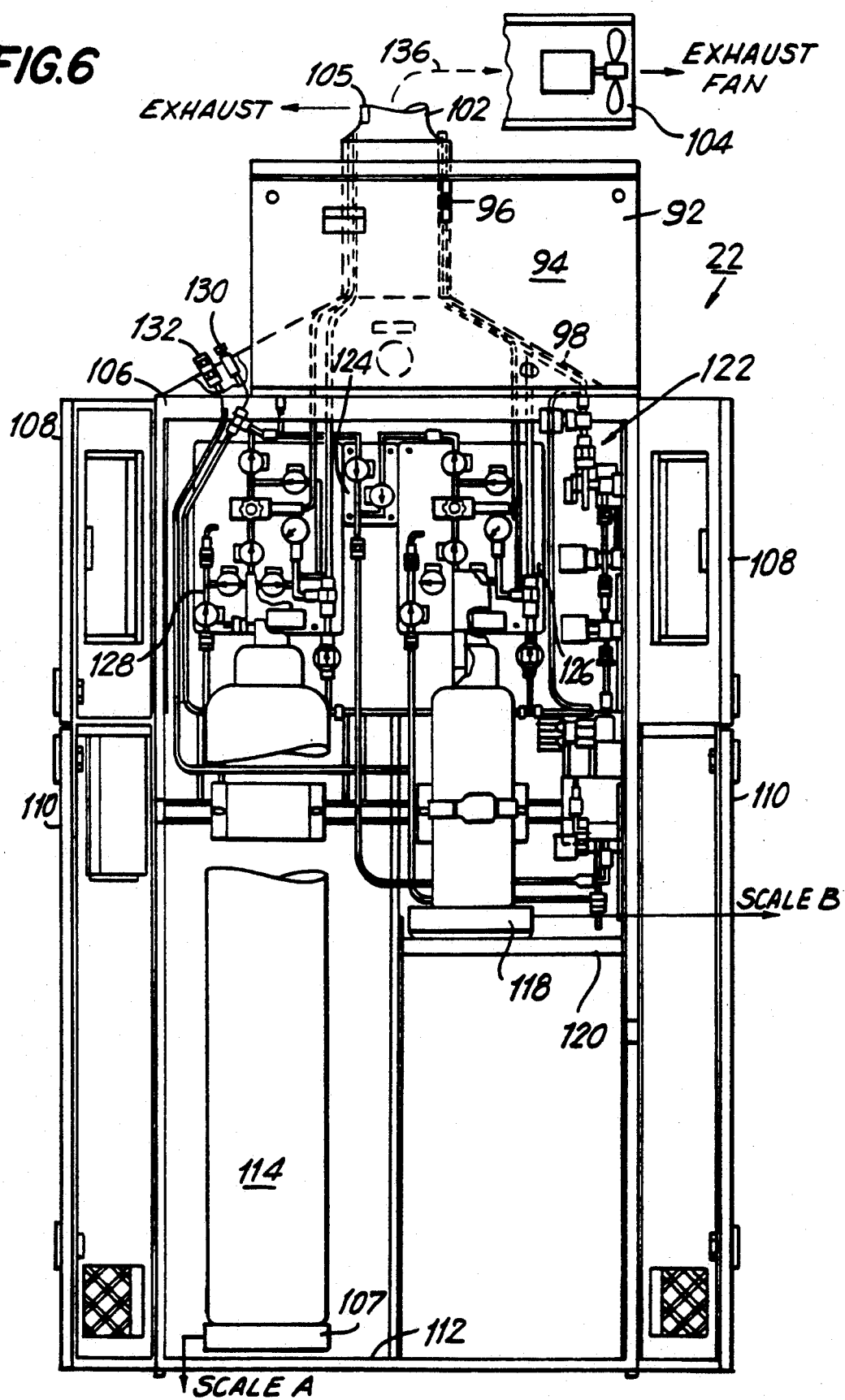
FIG. 6 is a front-elevation view of the cabinets shown in FIG. 5, with the front doors open and part of the components broken away for the sake of clarity.
Figure 8:
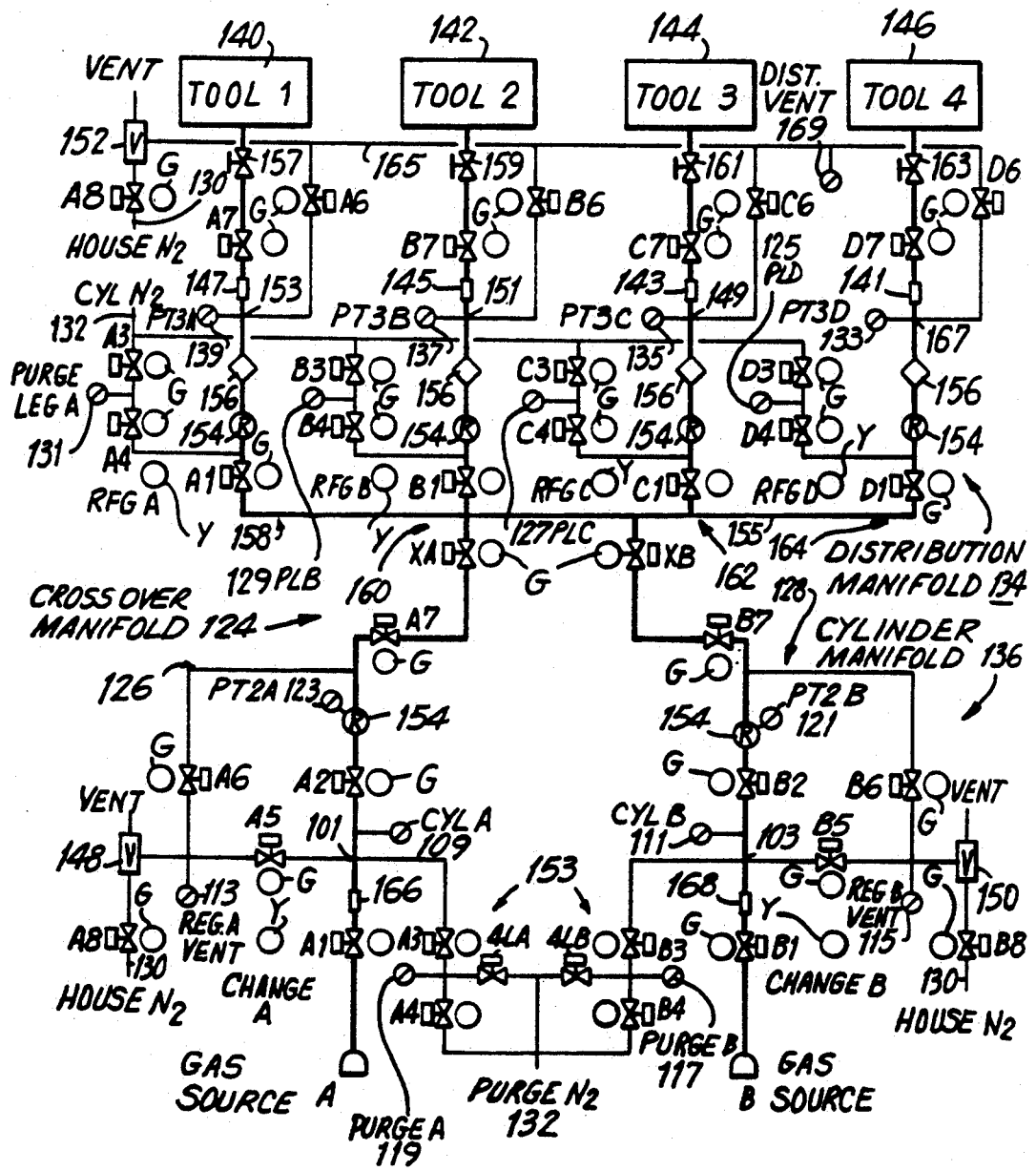
FIG. 8 is a schematic gas flow control diagram showing the distribution of gas by means of the gas cabinet of FIGS. 5 and 6.

The identity of the signal supplied on each analog input line 304 is marked to the left of the line. Those markings are shown in FIGS. 6 and 8 to indicate their source.

Figure 7:
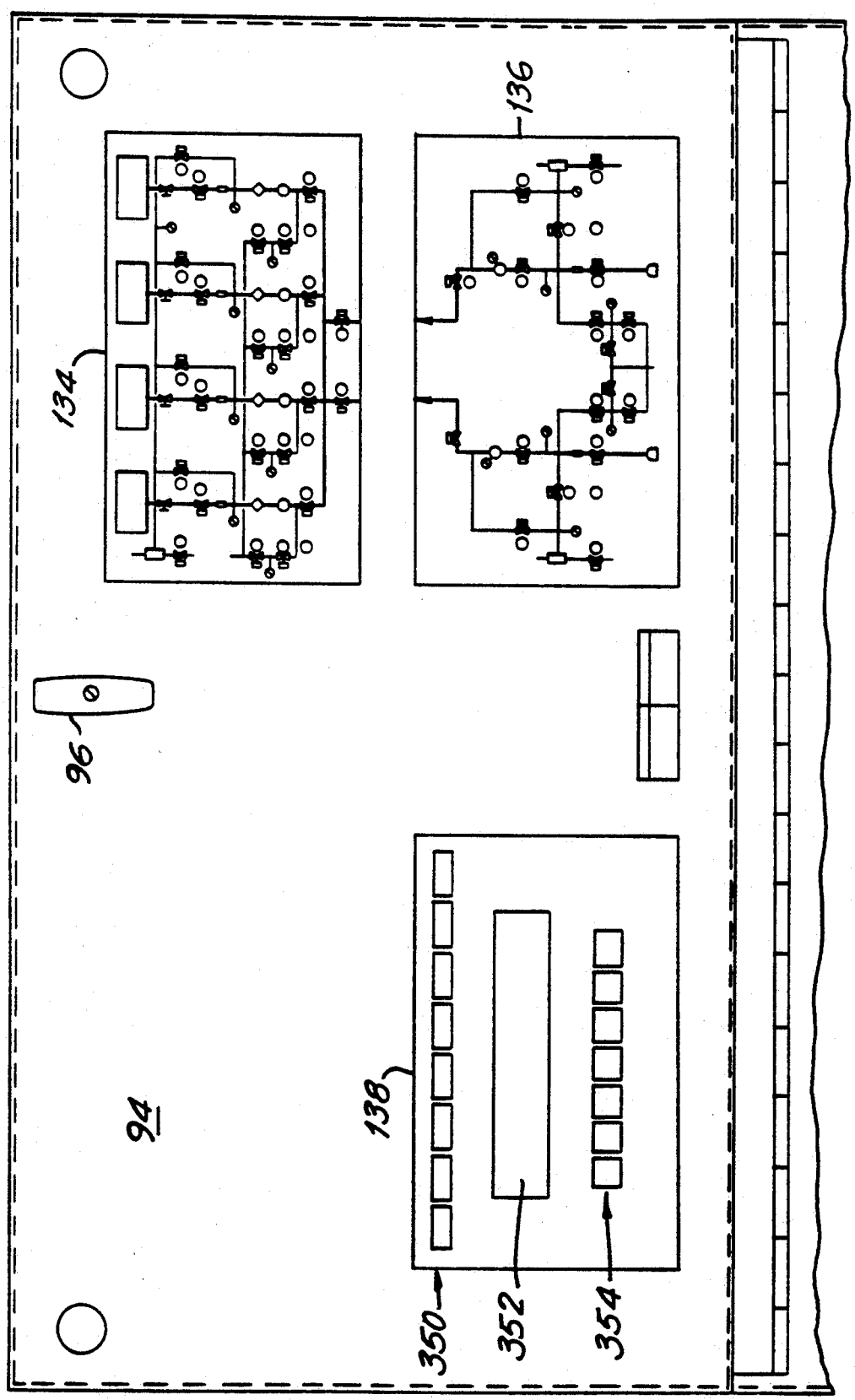
FIG. 7 is a front-elevation view of the control and display portion of the gas cabinet shown in FIGS. 5 and 6.
Figure 15:
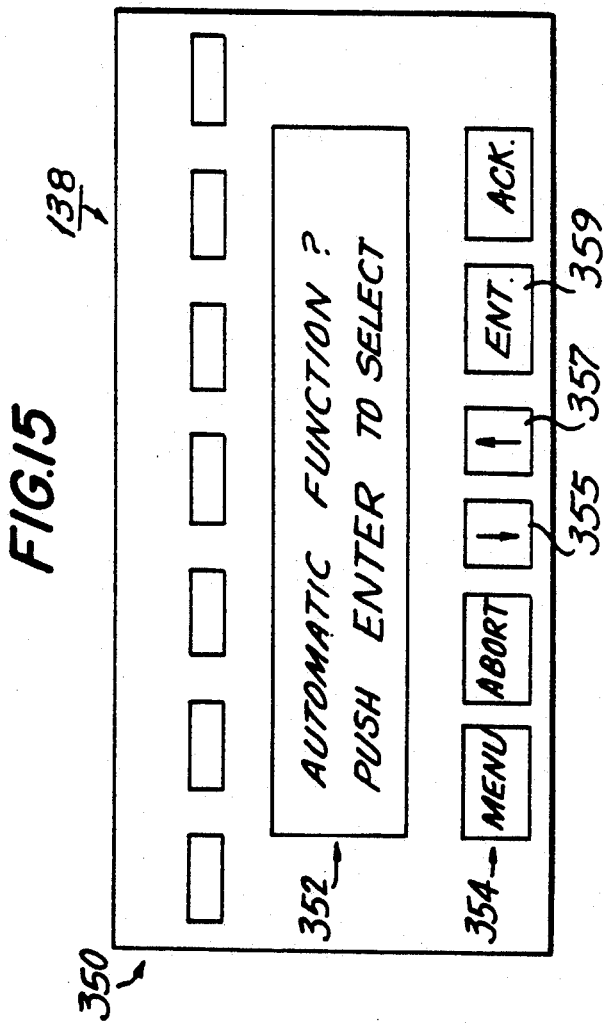
FIG. 15 is an enlarged view of the control panel and display shown in FIG. 7, and FIGS. 16–25 are displays which appear on the display screen of the supervisory control computer of the system shown in FIG. 1.

Also provided in the circuit 300 is a digital input/output unit 314 which receives digital signals and transmits them over a bus 316 to the CPU 306. The operator panel 138 which is shown in FIGS. 7 and 15, and the display panels 310 also receive signals over the bus 316 to display the various warning lights and indicators to be described below.

A set of DIP switches 307 is provided to set a code number to uniquely identify the cabinet to the rest of the system.

Further description of this circuitry and its operation will be given below.

CABINET CONSTRUCTION

Figure 5:
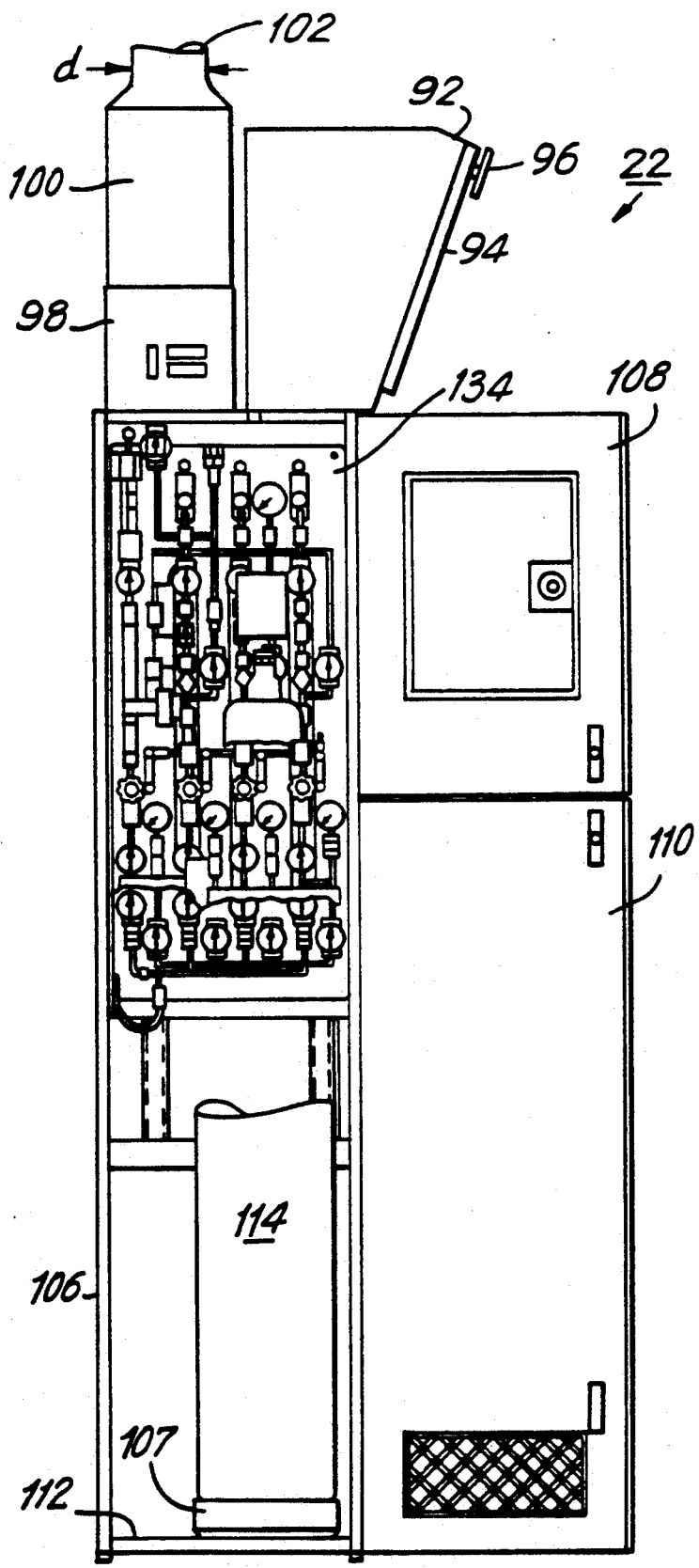
FIG. 5 is a side-elevation view partially broken away of one of the gas cabinets shown in FIG. 1, with the side panel removed to show the internal components.

FIGS. 5 and 6, show the construction of one of the cabinets 22. The cabinet 22 includes a rear wall 106, a bottom wall 112, and front doors 108 and 110. FIG. 5 is a left-side elevation view, with the front doors 108 and 110 open and the side-panel of the cabinet removed to show the inside components, with some of the components broken away.

The cabinet 22 includes a control housing 92 with a display panel 94 having a handle 96 for opening it. As it is shown in FIG. 5, the panel 94 is angled downwardly so as to be readily viewable by an operator standing in front of the unit.

The cabinet 22 has an upwardly-sloping upper wall 98 (FIG. 6) which ends in a centrally-located exhaust outlet conduit 100. Connected to the exhaust outlet is an exhaust duct 102 whose diameter "d" is less than the diameter of the exhaust conduit 100.

An exhaust fan 104, shown in FIG. 6 normally is located on the roof of the building in which the gas distribution system is located. It connects with the conduit 102, as indicated at 136, to exhaust air and other gases from the interior of the cabinet 122 to the atmosphere, where they can do no harm. Thus, the exhaust fan minimizes danger to operating personnel by removing process gases which might accumulate in the cabinet.

The cabinet 22 also includes a shelf 120 (FIG. 6) supporting a scale 118 and a cylinder 116 of process gas. A second cylinder 114 of process gas rests on a second scale 107 resting on the floor 112 of the cabinet. The scales 107 and 118 contain transducers which convert the weight of the gas bottles into analog signals which are among the analog inputs to the control cabinet circuitry shown in FIG. 4, labeled "SCALE A" and "SCALE B". The weight of the gas cylinders indicates the amount of gas left in them.

Gas is distributed from either bottle 114 or 116, as needed, so as to ensure an uninterrupted supply of process gas.

Various gas flow lines in the cabinet 22 include sections 126 and 128 which form a "cylinder manifold" 136 (FIG. 8) which conducts gas from the bottle 114 or 116 to a "cross-over" manifold 124 (FIGS. 6 and 8) which changes the bottle from which gas is supplied.

A gas distribution conduit system, called a "distribution manifold" is shown at 134 (also see FIG. 8). It includes four vertically aligned distribution "legs", which will be described in greater detail below, to distribute gas to 1, 2, 3 or 4 different tool locations simultaneously.

Also shown in FIG. 6 is an inlet 130 through which nitrogen from a "house" supply of nitrogen is supplied to the cabinet. An inlet 132 is provided for bottled nitrogen from a local supply.

At the top of FIG. 6, inside the duct 102, a pitot tube transducer 105 is mounted. The transducer 105 is used to measure the velocity of exhaust gas flow through the conduit for purposes of determining whether the exhaust flow is above predetermined safe level. The output of transducer 105 is labeled "EXHAUST" in FIGS. 4 and 6, and is one of the analog inputs to the data processing system of the cabinet.

GAS DISTRIBUTION SYSTEM IN CABINETS

FIG. 7 is an enlarged View of the front panel 94 of the cabinet 22. Displayed on the panel is an operator panel 138, and schematic diagrams of the distribution manifold 134 and the cylinder manifold 136.

FIG. 8 is a schematic diagram showing the piping and other flow control elements in a single one of the gas flow control cabinets. FIG. 8 is an enlarged reproduction of the two diagrams 134 and 136 which appear on the panel 94 of FIG. 7, except that the two diagrams have been joined together and modified, for the sake of clarity.

The distribution system shown in FIG. 8 consists of the three sections shown in FIGS. 5 and 6; the distribution manifold 134, the cylinder manifold 136 and the cross-over manifold 124.

In the diagram heavy lines indicate process gas distribution lines, whereas lighter lines indicate purge gas lines which are used only during purge and maintenance operations.

The cylinder manifold 136 consists of two halves, an "A" section 126 and a "B" section 128. The "A" section on the left side includes equipment for delivering process gas from a first source or cylinder A (cylinder 114 in FIGS. 5 and 6), and a right half, which is a mirror image of the left half, for delivering process gas from a second source "B" (cylinder 116 in FIG. 6).

The distribution manifold 134 includes four distribution "legs" 158 and 160, 162 and 164 ("A", "B", "C" and "D") each of which delivers process gas to a remote tool location 140, 142, 144 or 146, respectively.

The cross-over manifold 124 consists of a pair of valves "XA" and "XB", which are connected to a common conduit 55 which distributes gas from either source A or source B to any one or any combination of the four distribution legs.

In general, all of the valves shown in FIG. 8 are pneumatically operated with the exception of hand-operated valves 157, 159, 161 and 163 shown at the top of FIG. 8. Circles made with heavy lines are located in FIG. 8 next to various valves and are designated by the letter "G". Green LED's are located behind the transparent or translucent panel material in the circles. When the valve is open, the LED is on. Thus, each of these circles glows green to indicate when the valve next to it is open.

Other heavy circles marked with the letter "Y" glow yellow when a predetermined condition exists. Those in the distribution manifold marked "RFG A", "RFG B" etc. indicate when either leg A, B, C or D (158, 160, 162 or 164) is Ready For Gas; that is, ready for the delivery of process gas.

In the cylinder manifold 136, yellow indicator circles labeled "Change A" and "Change B" indicate when either gas cylinder A or gas cylinder B is empty and should be changed.

The smaller circles formed with lighter lines in FIG. 8 are gas pressure transducers.

The delivery of gas from source A to Tool 1, for example, is accomplished by the opening of valves A1, A2 and A7 in the cylinder manifold 136, valve XA in the cross-over manifold 124; and the opening of valves A1, A7 and 157 in the distribution leg 158 in the distribution manifold 134. It should be understood of course, that the delivery line between the end of a distribution leg and the tool to which it is connected can be relatively long; that is, the cabinet 22 often is up to several hundred feet from the tool location.

If process gas is to be delivered to Tool 2, the foregoing procedure is altered by opening valves B1, B7 and 159 in the distribution manifold. Similarly, process gas will be delivered to Tool 3 by opening valves C1, C7 and 161, and to Tool 4 by opening valves D1, D7 and 163 are opened.

If it is desired to deliver process gas to more than one tool at a time, this is accomplished simply by opening the valves in the appropriate delivery legs. Up to four separate tools can be supplied simultaneously by this means.

If it is desired to deliver gas from source B, such as when the quantity remaining in source A is too low, the valve XA in the cross-over manifold 124 is closed and the valve XB in that manifold is opened, and gas is delivered from source B to the line 155 and to all or any combination of the four tools, in the same manner as described above. Then, the A cylinder can be replaced, without interrupting gas flow to the tool.

In each of the process gas flow lines in the cylinder manifold 136, there is a pressure regulator 154. Similarly, there is a pressure regulator 154 and a filter 156 in each of the four delivery legs of the distribution manifold 134.

In the lower portion of the cylinder manifold 136 is a purge isolation section 153 containing valves A3 and A4 with a pressure transducer device 119 located between those valves. Similarly, there is a purge isolation section consisting of two series-connected valves B3 and B4 with a pressure transducer 117 in the right half of the cylinder manifold. Those transducers supply "PURGE A" and "PURGE B" analog input signals, as indicated in FIGS. 4 and 8.

Purge throttling valves 4LA and 4LB are provided to limit the flow of purge gas at certain times, as it will be explained below.

Similarly, each distribution leg in the distribution manifold 134 contains an isolation section consisting of valves 3 and 4 in series (A3 and A4; B3 and B4; etc.), and a transducer 125, 127, 129 or 131 to deliver a "PURGE LEG X" signal to the controller ("X" being A or B or C or D) to indicate a leak.

There is a flow switch 166 or 168 in each of the cylinder manifold process gas flow lines, and a flow switch 141, 143, 145 or 147 in each of the four distribution legs. These switches sense gas flow through them at an excessively high rate and send signals to the controller circuitry on the digital I/O unit 314 (FIG. 4) which cause the controller to shut all valves in the conduit in question to stop flow through it, and creates a high-priority alarm.

Other transducers and valve operations will be explained below.

CABINET MENU AND PROMPT DISPLAYS

Referring now to FIGS. 7 and 15, the operator control panel 138 contains a number of pushbutton controls 354, an LCD display 352, and a row of alarm lamps 350. The LCD display 352 will display two lines of character, with up to 20 characters per line.

The cabinet 22 is designed to enable the operator to quickly select and initiate functions with only a few pushbuttons, and a full keyboard is not needed. It is also designed to be interactive; that is, to lead the operator through the selection process by displaying appropriate "prompts" or instructions. This is accomplished by means of a layered menu.

Figure 16:
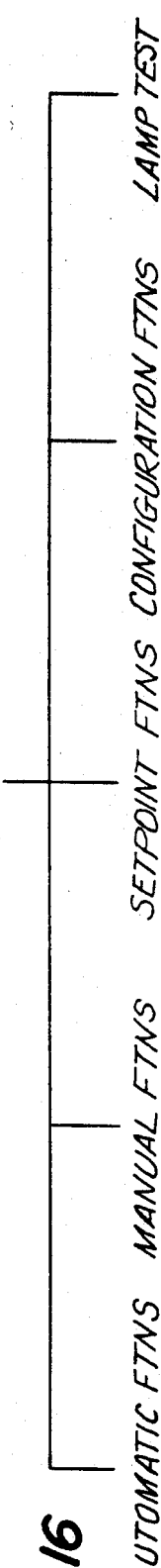

By pressing the "menu" button (FIG. 15), the functions listed in the menu shown in FIG. 16 are displayed, one at a time on the LCD display 352.

These are the highest menu layers. Within each major category shown, there are several sub-menus and/or sub-functions. To select a function, one merely need press the scroll-up button 357 or the scroll-down button 355 (FIG. 15).

The layered menu also allows protection of certain modes or functions from activation by other than qualified personnel. Each major function category, such as "Automatic" or "Configuration" functions, is protected by a password. Only those individuals given the password select functions within those modes. "Manual" mode requires two qualified persons, each with his or her own password, to enable operation.

Following are the automatic functions which can be selected if the "Automatic Functions" submenu is selected.

---
Purge to Change Cyl
Purge to Change Cyl A
Purge to Change Cyl B
Maintenance Purge
Cylinder Manifold A Maintenance Purge
Cylinder Manifold B Maintenance Purge
Manifold Leg Purge Function
Purge Leg A (Off)
Purge Leg B (Off)
Purge Leg C (Off)
Purge Leg D (Off)
Secure Manifold Leg
Secure Leg A
Secure Leg B
Secure Leg C
Secure Leg D
Startup Manifold Leg
Start up Leg A
Start up Leg B
Start up Leg C
Start up Leg D
Pump/Purge Distribution Leg
Pump/Purge Leg A
Pump/Purge Leg B
Pump/Purge Leg C
Pump/Purge Leg D
Distribution Maintenance Pump/Purge
Dist Maintenance P/P A
Dist Maintenance P/P B
Dist Maintenance P/P C
Dist Maintenance P/P D
Evacuate Delivery Leg
Evacuate Leg A (Off)
Evacuate Leg B (Off)
Evacuate Leg C (Off)
Evacuate Leg D (Off)
Clear Purge Isolation Leak Alarm
Clear Cylinder A Isolation Leak Alarm
Clear Cylinder B Isolation Leak Alarm -continued
Clear Leg A Isolation Leak Alarm
Clear Leg B Isolation Leak Alarm
Clear Leg C Isolation Leak Alarm
Clear Leg D Isolation Leak Alarm

---

When the "Manual Functions" submenu is selected, it is possible to manually operate each of the cylinder valves, distribution manifold valves, and cross-over manifold valves.

When the "Setpoint Functions" submenu is selected, following are the functions which can be selected:

---
Manifold Alarm Sets
Set Cylinder Empty Setpoint
Set High Cylinder Pressure
Set High Regulated Pressure
Set Low Regulated Pressure
Set Purge Isolation Fail Pressure
Manifold Purge Definition
Set # of Pre Purge Cycles
Set # of Post Purge Cycles
Set Minimum Purge Pressure
Set Maximum Vent Pressure
Set Purge Time
Set Vent Time
Enable Refill
Disable Refill
Distribution Alarm Setpoints
Set High Delivery Pressure
Set Low Delivery Pressure
Distribution Purge Function Definition
Set # of Purges
Set Minimum Purge Pressure
Set Maximum Vent Pressure
Set Purge Time
Set Vent Time
General Setpoints
Set Minimum Exhaust Flow Rate

---

The setpoints can be set by means of software routines described more fully in the above-identified pending patent application.

When the "Configuration Ftns" mode is selected, the following functions can be performed:

---
Configure Cabinet
Cylinder Pressure Range
Cylinder Manifold Regulated Pressure Range
Cylinder Manifold Purge Pressure Range
Cylinder Manifold Vent Pressure Range
Distribution Manifold Regulated Pressure Range
Distribution Manifold Vent Pressure Range
Cylinder Weight Range
Set Delivery Association
Select Line Leg A Assn.
Select Line Leg B Assn.
Select Line Leg C Assn.
Select Line Leg D Assn.
Select Exhaust Duct
10 inch Duct
8 inch Duct
6 inch Duct
Do Zero Calibration
Calibrate Cylinder Manifold A
Calibrate Cylinder Manifold B
Calibrate Distribution Manifold Leg A
Calibrate Distribution Manifold Leg B
Calibrate Distribution Manifold Leg C
Calibrate Distribution Manifold Leg D
Calibrate Scale A
Calibrate Scale B The steps taken by the operator to select the various functions are set forth in the following table:

| OPERATOR ACTION | SYSTEM RESPONSE |
|---|---|
| Press MENU | Displays the first item in the "Main Menu", which is "Automatic Function?" "Push ENTER to select" (See FIG. 15) |
| Press the UP or DOWN buttons 355 or 357 until the desired function displayed. | The display will scroll through available menu items The item displayed will be selected. This may be a function, which would begin its operation, or the next menu layer. We'll assume we've selected the next menu layer. The display will read "ENTER PASSWORD" |
| Enter the appropriate password. | The display will show an '*' for each character entered. If the password is correct, the display will show the first item in the selected menu. If incorrect, it will display "INVALID PASSWORD" |
| Continue stepping through the menu and selecting the desired function. | When the function is selected, by pressing "ENTER", it will start. |

Many of the functions have associated interlock conditions. If any of these interlock conditions are present, the menu prompt for the function will not appear on the display. Therefore, the existence of an interlock condition inhibits activation of the function.

To better understand the function of the interlocks, consider the case of "Purge To Change Cylinder A". If no interlock condition exists, the operator can step through the menu selection process and come to a point where the display reads "Purge To Change Cylinder A?" At this point the cylinder A purge cycle can be initiated. However, if a purge isolation leak alarm was active on cylinder manifold A, the display would not read "Purge To Change Cylinder A?". It would skip to the next valid function.

Details of some of the automatic functions now will be discussed.

AUTOMATIC PURGE TO CHANGE CYLINDER (A OR B)

When it is necessary to change either the A or the B gas cylinder to replace it with a fresh one, the toxic process gas should first be removed or purged from the gas flow lines in order to protect the workers making the change from being harmed by the toxic gas. The process gas is required to be pure, and special precautions are necessary to insure this purity. Therefore, the cylinder change must be accomplished without significantly exposing the flow lines to air or other extraneous gas, in order to prevent contamination.

Either the A section or the B section 128 of the cylinder manifold is purged by alternatingly exhausting the gas from each conduit, and then filling the conduit with a very pure inert purge gas such as nitrogen. This dilutes and replaces almost all of the process gas with harmless nitrogen.

This process is used instead of a flow-through purge, which might require purging the entire flow line from the cylinder through to the tool. Such a process would be extremely wasteful of both process gas and purge gas.

Following are the steps used in purging the cylinder manifold to change a gas cylinder.

First, the number of purge cycles to be used, and the time of each cycle, are pre-selected by qualified personnel in the Setpoint Function mode of operation.

Assuming that it is desired to change cylinder A, valve A8 in the cylinder manifold 136 is opened to supply pressurized nitrogen from the house supply inlet 30 to a venturi pump 148 which creates a vacuum in all parts of the conduit which are not isolated from the pump 148 by a closed valve. The venturi pump vents its exhaust to the exhaust system.

Valve A5 (and valve A2 for the first cycle) are opened for a predetermined time, with the valve on the cylinder and valve A7 closed, to evacuate the gas conduit extending from the cylinder to the valve A2.

The control system automatically measures the pressure at point 101 by means of the transducer 109 at the end of this period and checks to make sure that the vacuum is operating properly. This is done by checking to see if the pressure signal "CYLA" is below a predetermined Maximum Vent Pressure setpoint level (see above) set by the operator in the Setpoint Function mode. Up to three seconds extra, in addition to the pre-set vent time are allowed. If this condition is met, the sequence continues to next step. If not, the sequence is aborted and an alarm message is displayed on the panel 138.

Next, valves A2 and A5 are closed, and valves A3 and A4 are opened to supply purge nitrogen from a nitrogen cylinder supply for a predetermined purge time. This dilutes any process gas remaining in the manifold with nitrogen. During this phase, the pressure in the manifold must rise above the Minimum Purge Pressure (see above), which is preset by the operator in the Setpoint Functions mode. Up to three extra seconds in addition to the user-set purge time are allowed. If this condition is met, the purge function continues and the process is repeated for a number of cycles, called "Prepurge cycles", determined by the operator in the Setpoint Functions mode.

When the prescribed number of Pre-purge Cycles has been completed, the operator should change the process gas cylinder A.

When the bottle change is complete, the operator should push the ENTER button on the panel 138. This will cause the cylinder manifold to perform a series of post-cylinder-change purge cycles. These cycles are identical to those described above for the pre-change purge. The number of Post Purge Cycles can be set independently of the number of pre-change purge cycles, as it is indicated above.

The manifold next will be filled with process gas by opening valves A1 and A2, and then performing three short cycles of opening and closing valve A6 to allow process gas to flow into the conduit.

Now valve A8 now will close, turning off the venturi pump.

Finally, a routine is performed to check for a cylinder connection leak. The controller performs this check by reading the cylinder pressure by means of the transducer 123 which produces the output signal PT2A, then counting down for two minutes. If, at any point during this two-minute period, the cylinder pressure reading drops by over five percent of the initial value, the controller considers this to be a cylinder connection leak. If a leak is detected, an alarm message will be displayed. Otherwise, at the end of the two minute period, the function is complete.

If it is desired to change the B cylinder, the same procedures are used as those described for the A cylinder, except the separate valve system 128, as well as venturi pump 150 and venturi valve B8, are used instead of the venturi pump and valves on the left side 126 of FIG. 8.

CYLINDER MANIFOLD MAINTENANCE PURGE (A OR B)

The maintenance of the regulator 154 or other functions requiring access to portions of the process gas flow line downstream from the regulator 154, use a different purge operation, as follows.

Again, as with the purge to change a gas cylinder, the number of pre-maintenance purge cycles and the time of each cycle can be defined by an operator.

First, assuming that maintenance is being performed on the A side 126, valve A8 is opened to create a vacuum. Valve A5 and A2 are opened for a predetermined time. Next, valves A2 and A5 are closed and purge nitrogen is applied through valves A3 and A4 for a predetermined time to dilute any process gas remaining in the manifold. This cycle is repeated a predetermined number of times to complete the pre-maintenance purge. At this time, the operator can perform any required maintenance. During this period, the purge nitrogen valves A3 and 4LA and valve A2 are left open so that while the maintenance is performed nitrogen flows through the conduit and little or no air enters the conduit to contaminate it. Valve 4LA throttles the flow of nitrogen to a relatively low level, to minimize wasting of nitrogen during this phase of operation.

When the maintenance is complete, the operator pushes the ENTER button on the control panel 138. The control system will perform a series of post-maintenance purge cycles identical to those just described.

Next, the cylinder manifold will be filled with process gas. The cylinder valve will open, and, optionally three short cycles of opening and closing the bypass vent valve A6 will occur. When the refill is complete, the controller will close all valves, and the system again is ready to deliver process gas.

As with the cylinder change purge, the same process steps are performed in purging side B of the system, except the side B valves and venturi pump are used.

PURGE DISTRIBUTION LINE (A, B. C OR D)

The Purge Distribution Line function automatically turns purge nitrogen on and passes it through a distribution leg, and through the line to the tool. The function is performed according to the following sequence. Valve A1 (or B1, or C1 or D1) in the distribution manifold 134 is closed.

A delay of approximately two seconds then occurs.

Next, valves A3, A4 and A7 are opened to allow nitrogen to flow through the distribution leg to the tool, where it is vented. Nitrogen will continue to flow through the leg and line until the complementary function "Leg X Purge Off" is initiated by the operator. "X" is A or B or C or D.

This procedure, often referred to as a "flow-through" purge, is capable of producing the most thorough purge, but uses substantial quantities of nitrogen and vents the process gas in the whole line leading to the tool, thus wasting the gas.

LINE PURGE OFF (A, B, C OR D)

In the Line Purge Off function, a vacuum is placed on the purge isolation section by closing valves A3 and A4, and nitrogen is turned off so it no longer flows. Valve A7 also is closed.

Of course, the same procedure can be used in each of the separate distribution legs.

SECURE MANIFOLD LEG (A, B, C OR D)

The Secure Manifold leg function disables automatic delivery of gas from the selected distribution manifold leg. It does so by clearing the "Leg Enable" flag found in the cabinet's EEPROM memory. This means that gas will not be delivered until intentionally started by a qualified operator. Being stored in EEPROM memory, this status is not susceptible to being lost during power failure.

The Secure Manifold Leg function performs the following sequence.

Leg valves 1,3,4,6, and 7 are closed

The Leg x enable flag is cleared in EEPROM. A two second delay occurs. The display will read "Securing Leg x" during this period.

START-UP MANIFOLD LEG

The Start Up Manifold Leg function enables automatic delivery from the selected manifold leg. It does so by setting the "Leg Enable" flag found in the cabinet's EEPROM memory. This means that automatic gas delivery will be enabled until intentionally secured by a qualified operator. Being stored in EEPROM memory, it is not susceptible to being lost during power failure.

The function displays the message "Starting up Leg x" while setting the appropriate flag.

PUMP/PURGE DISTRIBUTION LINE (A, B, C OR D)

Referring again to FIG. 8, the purpose of this routine is to clear the toxic gas from one or more of the four distribution legs 158, 160, 162 or 164 (A, B, C or D) of the distribution manifold 134, and the line leading to the tool, when the flow-through process ("Purge Distribution Line") described above is not possible or is impractical.

The process to be described below has the advantage that it purges toxic gas from each distribution leg up to the first shut-off valve (not shown), which usually is located at the tool, without opening the line to allow purge gas to escape at the first shut-off valve. This provides purging where it otherwise might not be feasible, thus improving safety. It also confines all purging operations and venting to the vicinity of the cabinet where the most qualified personnel are on duty.

The operation now will be described with reference to distribution leg 158 (leg A) of the distribution manifold 34. However, it should be understood that the same process would be used in clearing each other distribution leg 160(B), 162(C) or 164(D), in a separate operation.

At the start of the operation, Valve A1 is closed to prevent toxic process gas from entering the distribution leg. Valves A3, A4 and A6 usually already will be closed. If open, they will be closed. Valve A7 may be either open or closed at the start of the procedure, but usually will be closed. The hand-operated valve 157 is open. Valves A1, A3, A4, and A6 are closed at this time because it is desired to close these valves before V8 is opened, in order to avoid contamination of the gas flow lines through the vent outlet of the venturi pump.

The venturi valve A8 now opens to admit house nitrogen, supplied through line 130, to the venturi pump 152, which evacuates gas from the line 165 and vents the gas safely to exhaust.

Next, the vacuum in the line 165 is applied to the distribution leg at point 153 by opening the valve A6. Valve A3 now is closed, and valves A6, A7 and A4 are opened.

The vacuum is thus applied to the delivery leg for a pre-determined vent time, which can be set by a qualified operator during the Setpoint Function mode.

At the end of this time period, the control system checks to make sure that the vacuum is operating properly by detecting the pressure at point 153 by means of the pressure transducer 139 connected to that point (similarly, pressure transducers 137, 135 and 133 are connected to points 151, 159 and 167, respectively, in the other distribution legs). The analog output of the transducer, PT3A, is sent to the control circuit (FIG. 4), where it is measured and compared with pre-set signal levels stored in memory. If the pressure is below a pre-set maximum vent pressure, which also can be set by a qualified operator, then the operation continues to the next step. If that pressure is not below the maximum vent pressure, the operation is aborted and an error message is displayed.

In the next step of the operation, valve A6 is closed and valve A3 is opened. This allows purge nitrogen from a cylinder to flow through valves A3 and A4 to the junction between valve A1 and the regulator 154, and into the evacuated distribution leg and line leading to the tool from valve A1 to the first shut off valve, thus filling and diluting any remaining process gas in that conduit. The time that nitrogen is thus allowed to flow into the delivery conduit is pre-determined by a qualified operator.

The transducer 139 also measures the purge pressure during this phase of the operation. The pressure measured at that point must rise above the pre-determined distribution minimum purge pressure. If this condition is met, the cycle just completed will be repeated a pre-determined number of times. The number being another parameter which can be set by a qualified operator. If the pressure does not rise above the minimum purge pressure, the operation is aborted and an error message is displayed.

Upon the completion of the pump/purge operation described above, the distribution leg and delivery conduit are cleansed of most of the process gas so that the system can be worked on safely by operating personnel.

PUMP/PURGE DISTRIBUTION LEG (A.B,C OR D)

This operation is used to clear toxic gas from any distribution leg from valve V1 to the hand-operated valve 157, 159, 161 or 163. This is done for the purpose of clearing only that section, instead of the whole line leading to the first shut-off valve, in order to facilitate changing the filter 156 or performing other maintenance in the distribution leg. This operation is exactly the same as that described above for the Pump/Purge Distribution Line operation, except that the hand-operated Va)Ve 157, 159, 161 or 163 is shut at the start of the procedure, and remains closed so that gas is not evacuated from the line extending to the tool. Thus, wasting gas is avoided and time is saved in enabling the changing of the filter or performing other maintenance.

After the filter has been changed or other maintenance has been completed, the pump/purge operation is repeated in order to clear the distribution leg of any impurities which might have been introduced during the maintenance.

EVACUATE DELIVERY LINE (A,B,C OR D)

The Evacuate Delivery Line function applies vacuum to the selected delivery leg and the line leading to the tool by opening valves V8 and then V6, with V1 closed. If used in conjunction with the application of purge source on the other end (the tool end) of the delivery line, it will clear the line of toxic gas through the cabinet's vent by a straight flow-through process, but with the gas flowing in a direction opposite to that used in the "Purge Distribution Line" process described above.

Once initiated, vacuum will continue to be applied until terminated by the operator via the Line Evacuate Off function.

LINE EVACUATE OFF (A,B,C, OR D)

The Line Evacuate Off function places a vacuum on the purge isolation section (valves 3 and 4); and then turns off vacuum from the distribution leg. Valves 4, 6 and 7 are closed. If no other legs require vacuum, the venturi valve 8 also is closed.

The purge isolation section referred to above consists of valves A3 and A4 in combination. The purge isolation section is provided for the purpose of isolating the purge source from the delivery leg, and accurately indicating any leaks. A vacuum is maintained in the conduit between the valves 3 and 4 in order to better detect such a leak.

CLEAR CYLINDER PURGE ISOLATION ALARM (A OR B)

Referring again to the cylinder manifold section 136 of FIG. 8, if a leak should occur in the purge isolation section, an alarm is set off. A mechanism is provided by the controller for automatically evacuating the purge isolation section 153 and clearing the alarm.

In clearing the alarm, valves 3, 5 and 8 are opened, while valves 2,4 and 7 of the cylinder manifold are closed to create a vacuum in the isolation section. After five seconds, the vacuum is removed and valves 3, 5 and 8 are closed. The vacuum existing between valves 3 and 4 has been restored, so as to enable detection of a future leak.

CLEAR DISTRIBUTION PURGE ISOLATION ALARM (LEGS A,B,C, OR D)

The procedure described above for clearing the purge isolation leak alarm for the cylinder manifold also is used to clear the leak alarm for the isolation sections A3-A4, B3-B4, etc. of the distribution manifold 134. The isolation section pressures are measured by transducers 125, 127, 129 and 131.

MANUAL FUNCTIONS

When the Manual Function mode of operation is selected from the main menu (see above), and when two passwords are used by two qualified maintenance persons, any valve can be operated manually. Opening or closing of a particular valve simply requires selection of the proper valve prompt from the screen and entering it with the ENTER button from the control panel 138 (FIG. 15).

In the Manual mode, various setpoint functions can be set by the qualified operators, as follows.

Alarm and warning indications
Cylinder Empty
High Cylinder Pressure
High Regulated Pressure (Cylinder Manifold)
Low Regulated Pressure (Cylinder Manifold)
Purge Isolation Fail
High Delivery Pressure
Low Delivery Pressure
Minimum Exhaust
Purge cycle definitions
Manifold Purge definitions
# of pre-purges
# of post purges
minimum purge pressure
maximum vent pressure
purge time
vent time
Refill On/Off
Distribution Purge definitions
# of purges
minimum purge pressure
maximum vent pressure
purge time
vent time Note that all pressure readings and setpoints are in terms of absolute pressure-psiA. Therefore, the reference pressure for the system is absolute zero pressure, not atmospheric pressure. That is, the reference pressure is approximately negative 14.7 psiG, at sea level.

Once the desired set points have been reached they can be permanently stored in memory by pressing the ENTER button. This stores the set points in the EEPROM where it will be stored even if the cabinet loses power. Thus, battery-backed memory is not required.

Of course, as it is well known, EEPROM's can be electronically erased so that new data can be stored in them, and they will operate in this manner for a relatively large number of cycles (e.g. 100 to 50,000 or more) depending upon the needs determined by the frequency expected for changes of setpoints etc.

SETPOINT FUNCTIONS

Following is an explanation of the setpoints which can be selected in the "Setpoint Functions" mode.

Cylinder Empty Setpoint

The cabinet determines that the process gas cylinder is empty based on either weight or pressure. If the cabinet is defined as one having a weighing scale, the setting is based on weight. Otherwise, the setting is based on cylinder pressure. In either case, "Cylinder Empty" is defined as occurring when the weight or pressure falls below this setting.

High Cylinder Pressure Setpoint

This setpoint is used to test a cylinder for over-pressure or another problem such as temperature rise, pressure applied from an inappropriate source, etc. If the cylinder pressure should read above this setpoint value, the "High Cylinder Pressure" Alarm will occur. The pressures are measured by the transducers 109 and 118 (FIG. 8), which transmit "CYL A" and "CYL B" analog signals to the control circuit (FIG. 4).

High Regulated Pressure Setpoint

This setpoint is used to test the pressure downstream from the cylinder regulators 154, and is measured by the transducers 121 and 123, which send signals "PT2A" and "PT2B" to the control circuit shown in FIG. 4. This will determine "Regulator Creep" in that area. The setpoint should be set somewhat above the normal operating pre-regulated pressure.

Low Regulated Pressure Setpoint

This setpoint is used to test to determine when the regulated pressure measured by transducer 121 or 123 falls below an established minimum pressure. It is used to ensure that sufficient gas pressure is available to the distribution manifold 134 (FIG. 8). A regulated pressure reading below this setpoint will result in a "Low Regulated Pressure" alarm.

Purge Isolation Fail Setpoint

This setpoint is used as a basis for determining if either valve V3 or V4 in the purge source line has failed. A pressure reading above this setpoint, when not purging, indicates that gas has leaked from one direction or the other.

As it has been noted above, at the end of each a purge cycle, a vacuum is created in the section of pipe between V3 and V4. The setpoint should be set at a pressure above the vacuum pressure by an amount which would indicate that there is a leak, if that pressure is reached after a certain period of time.

Low Delivery Pressure Setpoint

The Low Delivery Pressure setpoint is used to determine when insufficient gas pressure for proper operation is present downstream from the regulator 154 in any distribution leg. This pressure is measured by the transducers 133, 135, 137 and 139. A pressure below this setpoint, when delivering gas, results in a "Low Delivery Pressure" alarm.

High Delivery Pressure Setpoint

A "High Delivery Pressure" alarm occurs when the pressure measured by any of transducers 133, 135, 137 and 139 is too high, usually due to regulator creep.

Minimum Exhaust Setpoint

The Minimum Exhaust setpoint is set as the minimum acceptable exhaust gas flow rate through the exhaust duct 102 (FIG. 6) for safe cabinet operation. It is interlocked with the most significant cabinet valve and gas delivery operations, to disable those operations under "Low Exhaust" conditions.

Purge Setpoints

The computer program steps utilized in the above purge operations and setting of purge parameters are given in the above-identified pending patent application and will not be repeated here.

CONFIGURATION FUNCTION

When the "Configuration Functions" mode is selected, a qualified operator can modify or establish the following parameters.

Cylinder pressure transducer range
Cylinder manifold regulated pressure transducer range
Cylinder manifold purge pressure transducer range Cylinder manifold vent pressure transducer range
Distribution manifold regulated pressure transducer range
Distribution manifold vent pressure transmitter range
Cylinder weight range
Delivery association for each distribution leg
Exhaust duct size
Zero calibration for each manifold
Zero calibration for each scale Pressure Range Selections The range of the pressure transducers can be changed to accommodate the use of the transducers with different gases, or for any other reason.

As an example, the pressure range selection is performed simply by using the arrow keys 355, 357 on the panel 138 (FIG. 15) to change the range until the desired range is displayed (e.g. 0 to 100 psiA or 0 to 3000 psiA). Then ENTER is pressed to select the range. The selection of the range of the voltage of the analog output signal of each transducer (e.g. 0 to 5 volts or 1 to 5 volts) also can be selected by a similar procedure.

Cylinder Weight Range Selection

Cylinder weight range selection is similar to the pressure range selection described above. One additional option will allow the selection of "No Device Present" for those cabinets not having a scale.

Delivery Association (Leg A, B, C or D)

Each distribution leg of each cabinet is associated with a specific tool. The tools are wired to the Tool Interface Controller (TIC) 42 shown in FIGS. 1 and 4 and discussed above. Each tool is assigned a number associated with the position in the TIC to which it is wired. This number, (e.g., 0 through 120), is stored in the memory of the cabinet for the leg which is connected to deliver gas to the tool. In operation, when the tool (say Tool #32) requests gas by closing its contacts connected to the TIC 42, all cabinet legs having a matching stored delivery association (32) will be opened to deliver gas.

The delivery association stored in the memory of each cabinet can be changed simply by operating the up-down keys 355 and 357 and the ENTER key 359 on the panel 138 (FIG. 15), in the manner described above for other configuration selections. Re-wiring of the tools is not required.

SELECT EXHAUST DUCT SIZE

One of the advantageous features of the invention is that it allows the user to adapt the gas cabinet to correctly measure the cabinet exhaust gas flow rate through the outlet duct 102 (FIGS. 5 and 6) despite a difference between the diameter of the outlet duct 100 on the cabinet and the diameter "d" of the duct 102. This can be done by means of a few keystrokes on the control panel 138 (FIG. 15), in the manner described above. This allows each gas cabinet to be moved to a plant location in which exhaust ducting already is installed, without having to replace the ducting to match that of the cabinet. Moreover, the adaptation is fast and simple.

Referring again to FIG. 6, as noted above, a pitot tube device 134 is mounted in the duct 102 to measure the velocity of the gas flowing through that conduit. The device 134 includes a transducer which converts the differential pressure measured by the pitot tube device into an electrical signal. This signal is delivered on the "EXHAUST" line (FIG. 4) to the analog input circuit 302 which converts the analog input signal into a digital output signal which is delivered to the CPU 306. The CPU then computes the flow rate according to the following equation:

$Flow = D \times \sqrt{P}$

Where: Flow = Exhaust flow in cubic ft./minute
$D$ = Duct size constant (examples: $D = 1425$ for a 10 inch duct and 1020 for an 8 inch duct)
$P$ = Differential Pressure output of pitot tube device, in inches of water Stored in the memory 308 of the control system shown in FIG. 4 are at least three different duct constants, as well as the algorithm corresponding to the above equation.

When the operator selects one of the duct sizes by manipulation of the pushbuttons on the control panel 138 (FIG. 15), the selection is stored in memory, and the program of the controller causes each subsequent reading from device 134 to be operated upon according to the algorithm to give correct indication of the flow rate through the exhaust duct. The operator also can select the minimum acceptable flow rate, in the manner described above, in accordance with standards that are set up to insure adequate ventilation of the cabinet to protect operating personnel. If, for some reason, the flow rate should fall below this minimum level at any time during operation, an alarm is activated to indicate that correction is needed.

Once the exhaust duct size has been selected, that selection is retained in EEPROM and is not lost even if the controller suffers a loss of power.

This feature of the invention facilitates and reduces the cost of installation of the gas flow control cabinets at various existing plant locations, regardless of variations of the exhaust duct size. It increases the versatility of the cabinet by increasing the feasibility of moving it to new locations.

ZERO CALIBRATION

The transducers which are used to measure gas pressure drift over a period of time. Therefore, the transducers must be re-calibrated from time to time in order to restore their accurate operation.

The transducers tend to drift both in the zero readings and in the "span". The "span" is the difference between the electrical output at zero and that at full scale. Typically, the span drift is less significant that the drift of the zero point. This is because the pressures which are measured during purge tend to be very close to the zero point of the transducer range. If the transducer zero reading has drifted by an amount which is significant compared to the minimum and maximum pressures permitted during purge cycles, the safety verification of the system is not valid. This can result in either a serious safety problem, or the inability to perform a purge cycle. For these reasons, the zero readings usually require relatively frequent calibration, whereas the span seldom requires calibration.

In the past, as it has been explained briefly above, re-calibration of the transducers has been performed once every three to six months. This has been done manually, and the procedure can take four to eight hours per gas cabinet. A typical large semiconductor fabrication plant may have one hundred to five or six hundred such gas cabinets. Thus, it is evident that a relatively large amount of labor is required for re-calibration. This creates a significant operating cost. Furthermore, each of the gas cabinets, and its related semiconductor manufacturing tools, is out of operation for a significant period of time, thus reducing the productivity of each gas distribution system, and of the entire plant.

In accordance with the present invention, the zero point of each transducer is re-calibrated automatically in a matter of a few minutes or seconds. This is done by the manipulation of the control pushbuttons on the panel 138 shown in FIG. 15.

The basic procedure for zero calibration is to first subject the transducer to a known pressure or weight which is at or very near its zero point, and read the electrical output generated by the transducer. Next, the difference between the measured value and the ideal value of the transducer is calculated. That difference, called an "offset", is stored in non-volatile memory (EEPROM) and then is used to compensate all subsequent readings by adding it to or subtracting it from the readings of the transducers during operation.

The computer program used to perform the zero calibration and subsequent operation described above is shown schematically in FIGS. 9 and 10 of the drawings.

Figures 9, 10:
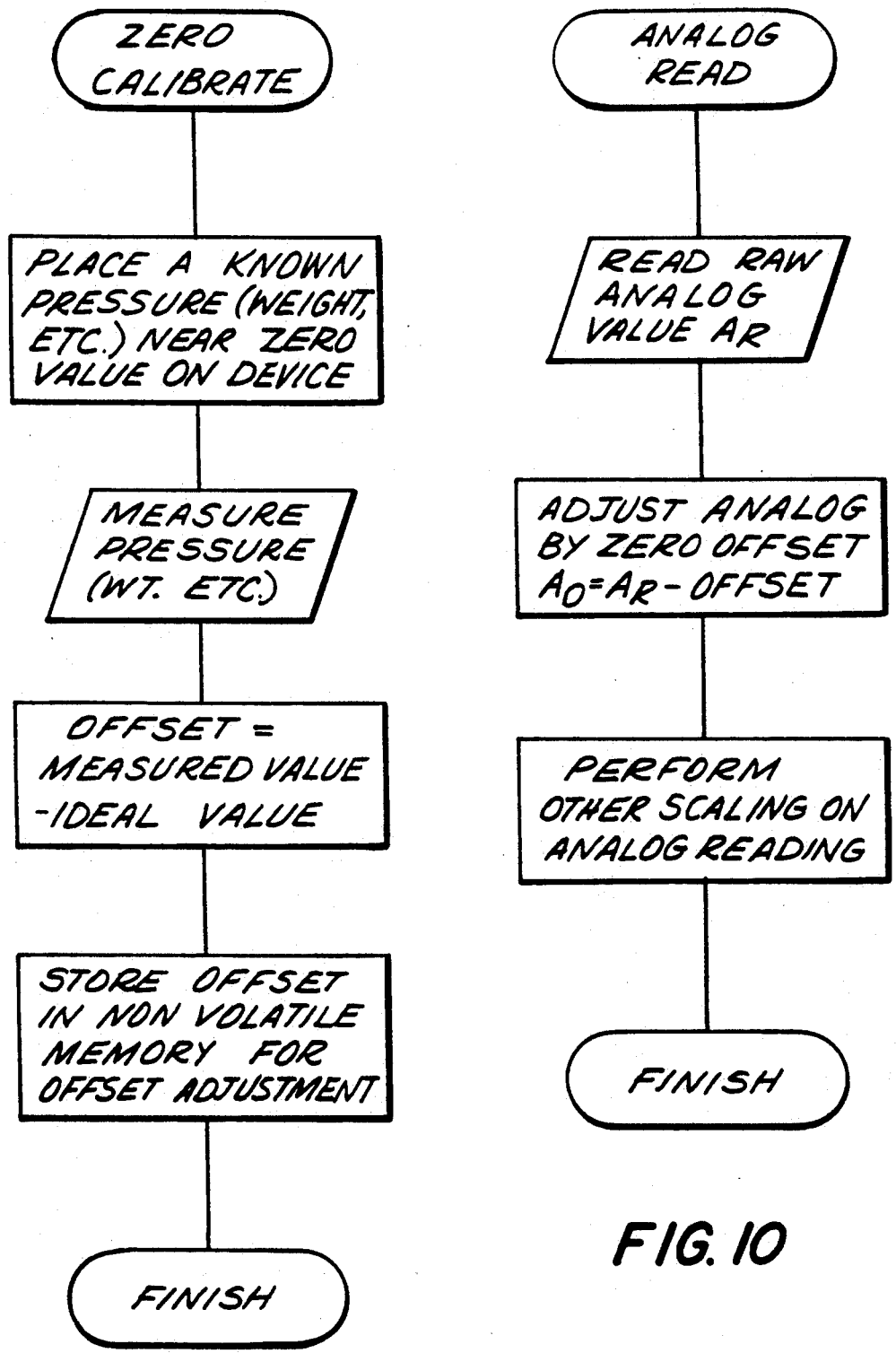
FIGS. 9 and 10 are generalized flow diagrams for the computer programs used for automatic zero calibration of transducers used in the gas flow control units.

FIG. 9 shows the zero calibration routine described above, and FIG. 10 describes the use of the offset value stored in the zero calibration routine to adjust subsequent analog readings. The last step in the process illustrated in FIG. 10 is to perform other scaling on the reading. That is, the signal may be amplified or otherwise modified in magnitude, as is needed by the control system.

Scale Zero Calibration

Figure 11:
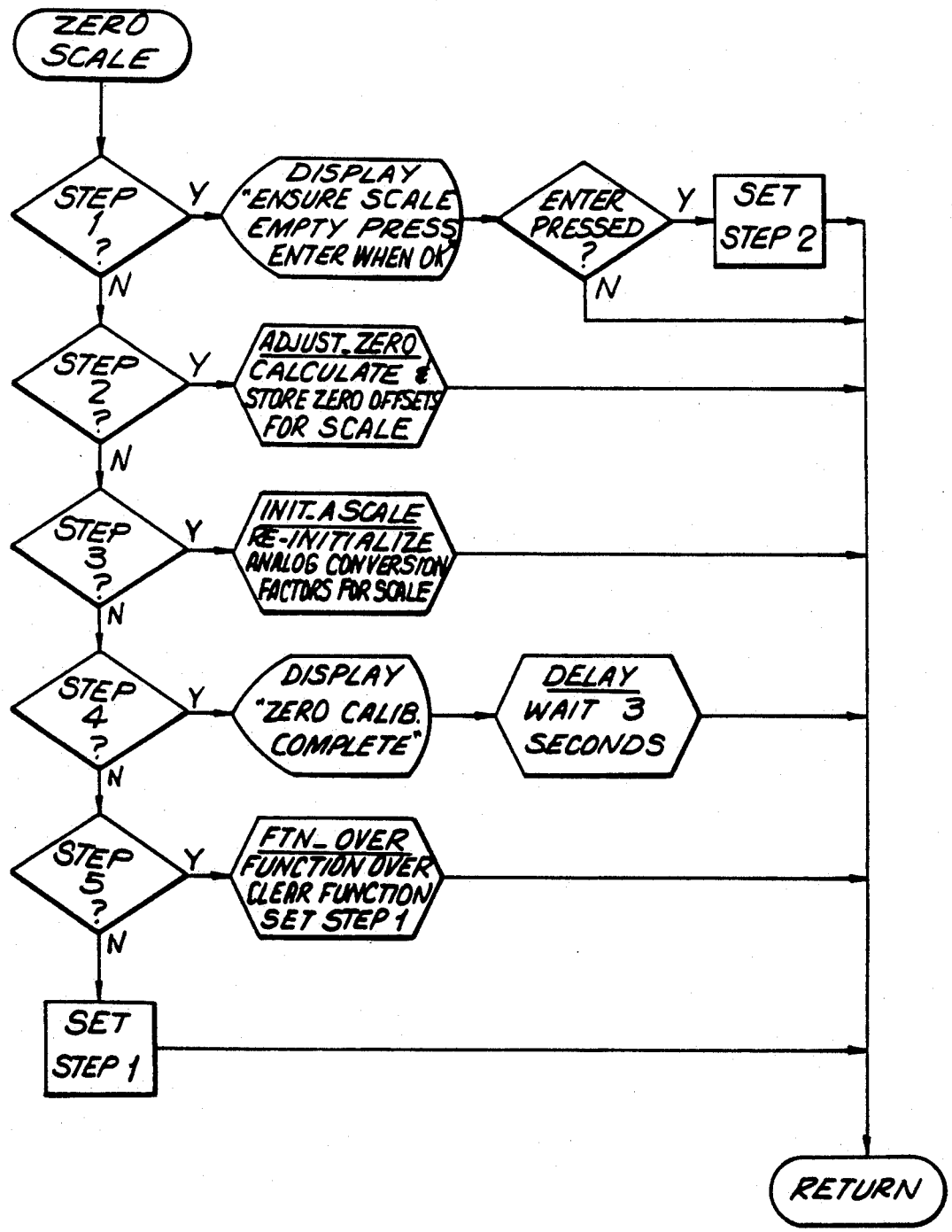
FIG. 11 is a flow diagram for a computer program used for zero calibration of a weighing scale used to measure the contents of one of the gas bottles in the cabinet of FIGS. 5 and 6.

FIG. 11 is a flow chart describing the computer program routine used to calibrate the zero setting of the scale transducers. The same routine is used for both the A scale and the B scale, if two scales are used in the cabinet.

The program uses a multi-tasking routine. Each of the decision diamonds in the left hand portion of FIG. 11 determines whether the step is in progress or not. If the answer is "yes", the step proceeds until it is completed by the delivery of a return signal, at which point the program proceeds to step 2. The same procedure is followed for each subsequent step in the routine.

In step 1, the display on control panel 138 (FIG. 15) states "Insure scale empty, Press ENTER when ok". This encourages the operator to make certain that the scale being calibrated has no weight on it. The program then determines whether the "ENTER" button has been pressed, within a certain length of time. If the answer is yes, step 2 is set. If no, the routine returns to start.

In step 2, the computer compares the reading of the scale transducer with what it should be, and calculates and stores a zero offset value in memory (EEPROM).

When step 2 is complete, step 3 is performed in which the analog conversion factors for the scale are re-initialized and stored in memory.

After step 3 is complete, step 4 is performed in which a display "zero calibration complete" is formed on the control panel display. After a delay of three seconds, step 5 is performed in which a "Function Over" display is produced and the function is cleared. Step 1 is set, and the routine is ready for the start of another operation.

Zero Calibration of Distribution Leg Pressure Transducers

Figure 12:
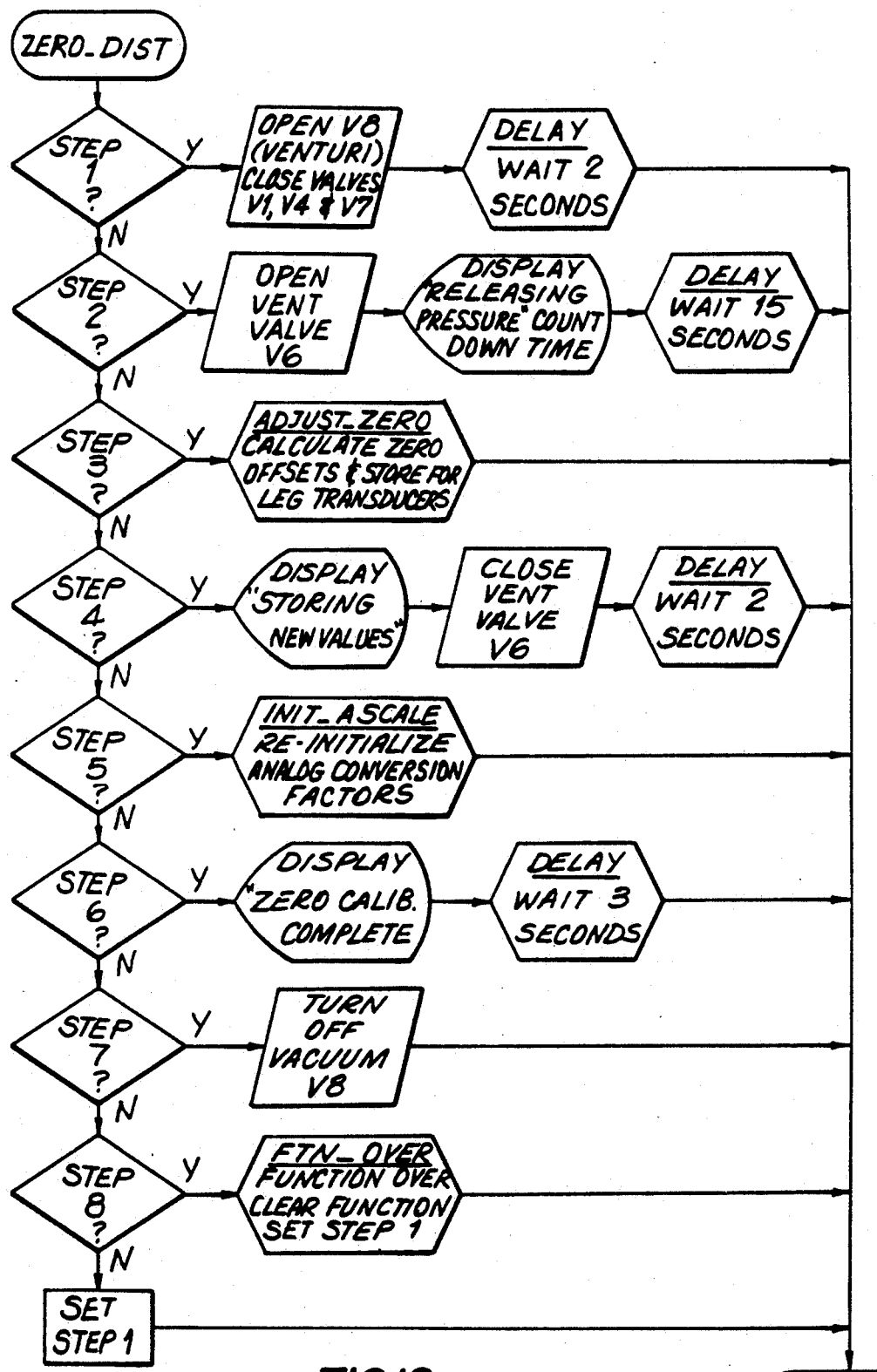
FIG. 12 is a flow diagram of a computer program used to zero-calibrate the gas pressure transducers in the distribution gas flow legs of the cabinet shown in FIGS. 5 and 6.

FIG. 12 shows the computer program routine used to perform a zero calibration of the pressure transducers in one of the four distribution legs in the distribution manifold 134 (FIG. 8). In FIG. 12, the valves that are open and closed are referred to with a "V" preceding the number of the valve rather than the letters "A" or "B" etc. used in FIG. 8. This is done for the reason that the routine applies to any one of the four legs and thus the valve identification is generalized.

In the first step, V8, the venturi valve is opened to apply a vacuum to line 165, and valves V1, V4 and V7 are closed. V1 is closed to shut off the flow of process gas. V4 is closed to shut off the flow of nitrogen, and V7 is closed to minimize the length of conduit to be evacuated.

It is a notable feature of this aspect of the invention that, by using absolute pressure values rather than atmospheric pressure values, and by using the vacuum source as a reference pressure source, a calibration reference source is provided by the simple expedient of using the vacuum source which already exists for purging the gas flow lines. This not only avoids extra equipment costs, but it has the added benefit of preventing the opening of the gas flow lines to atmosphere, which might be required if atmospheric pressure were used as the reference pressure, and thus avoids contaminating the gas lines.

In step 2 shown in FIG. 12 the vent valve V6 is open to evacuate the distribution leg between valves V1 and V7, thereby subjecting the transducers in the leg to the vacuum as a reference pressure. While the distribution leg is being evacuated, a message "Releasing Pressure" is displayed for a certain period of time. Then, after a delay of fifteen seconds to insure that the measured pressure has dropped to the relatively constant pressure of $-11.7$ psiG ($+3$ psiA) of the venturi pump, the program continues to step 3.

In step 3, the zero offset values are calculated and stored for each of the separate leg pressure transducers, in sequence.

In step 4 the message displayed is "Storing New Values". Vent valves V6 are closed and, after a wait of two seconds, step 5 is initiated. Steps 5 and 6 correspond, respectively to steps 3 and 4 of FIG. 11, and will not be explained further here.

In step 7, the vacuum valve V8 is turned off, and in step 8 the function is ended and the program returns to step 1 to wait for another operation.

Of course, the same process is repeated for each of the other distribution legs in the cabinet.

Zero Calibration of the Cylinder Manifold Transducers

Figure 13:
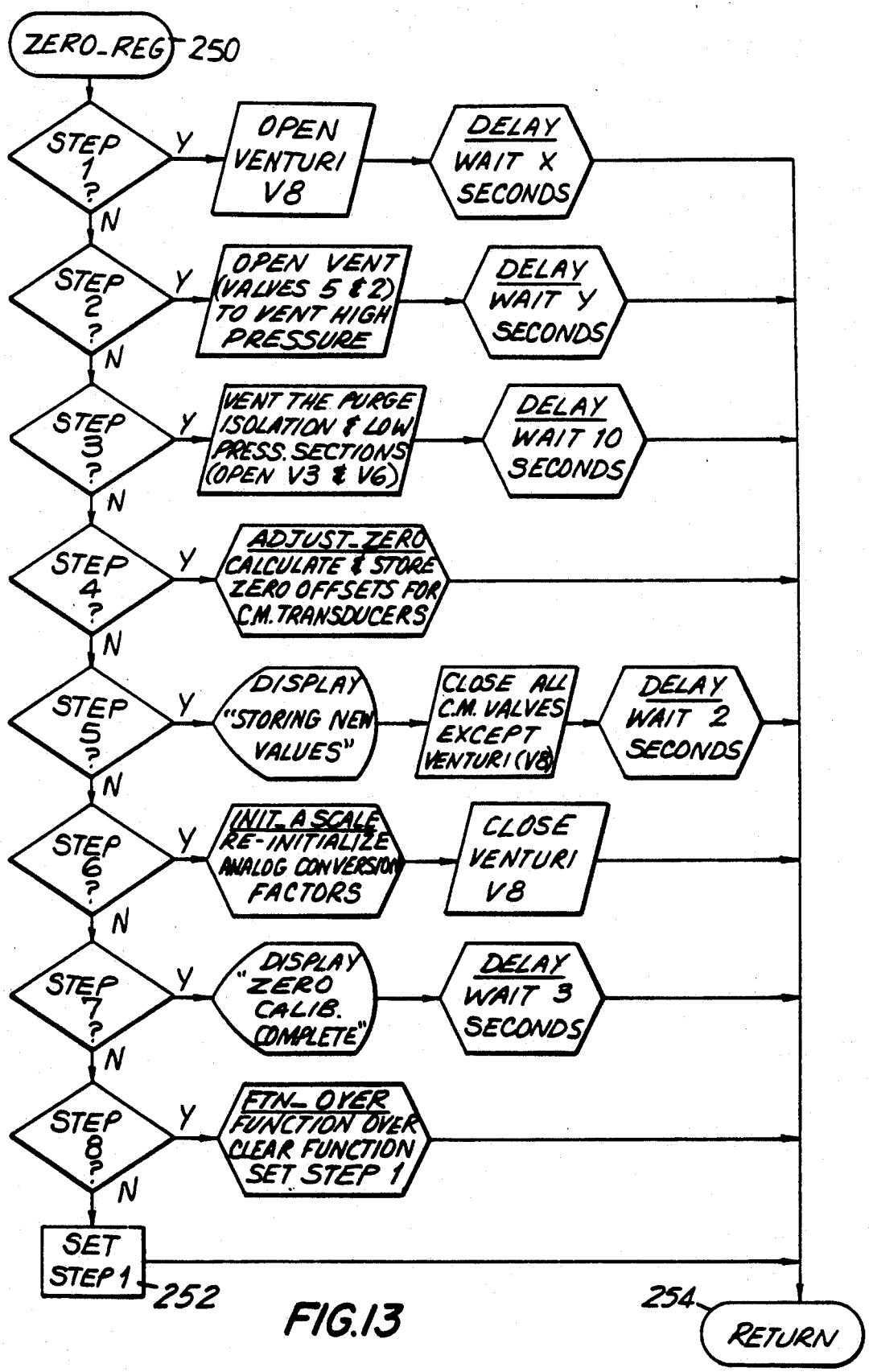
FIG. 13 is a flow diagram of a computer program used for zero calibration of the transducers in the gas flow lines leading from the gas bottles in the gas cabinet of FIGS. 5 and 6.

FIG. 13 is a flow chart for the program used to perform a zero calibration for the pressure transducers in the cylinder manifold 136 (FIG. 8). These include transducers 121, 123, 109 and 111, 113 and 115, 117 and 119 shown in FIG. 8.

As in the distribution leg transducer calibration routine, the vacuum pressure produced by the venturi pumps 148 and 150 by opening the venturi valves A8 and B8 are used to provide a reference for the transducers.

In step 1 of FIG. 13, venturi A8 is opened. After a delay of X seconds (a value which depends on the type of cabinet) the program proceeds to step 2.

In step 2, the vent valves V5 and V2 are opened. Valve V1 is closed. After a delay of Y seconds, which also depends on the type of cabinet, the program moves to step 3.

In step 3, valves V3 and V6 are opened, thus exposing the transducers to the low reference pressure provided by the venturi pumps. After a delay of about ten seconds, the program proceeds to step 4.

The various delays in the pressure transducer calibration routines are provided in order to allow time for stabilization of the transducer readings, and to insure that atmosphere does not enter and contaminate the process gas manifold.

In step 4, the offsets for the various transducers are calculated and stored. Then, in step 5, the message "Storing New Values" is displayed, and all cylinder manifold valves except venturi valves V8 are closed. After a delay of two seconds, the program proceeds to step 6.

In step 6 the analog conversion factors are re-initialized, and the venturis V8 are closed.

Finally, the program is completed in steps 7 and 8, as in the programs described above.

As it can be seen from the foregoing, the automatic calibration of the transducers can be performed in a few minutes instead of several hours. This saves a great deal of labor costs and down-time for the flow control units. Thus, labor costs are reduced, and productivity of the gas distribution system is increased.

COMMUNICATIONS BETWEEN THE TOOL INTERFACE CONTROLLER AND GAS CABINETS

There are several types of messages which are used in communication between the tool interface controller (TIC) and the gas flow control cabinets. The following is a list of the message types which are sent by the TIC to the cabinets.

1. Polling Messages. The first message type polls the cabinets sequentially at the rate of about four messages per second or less. Communications are at the rate of approximately 9,600 baud. In response to each polling message, one of the cabinets sends a data packet to the TIC. The data packet will be described in detail below.

2. Broadcast Messages. Once per second, the tool interface controller broadcasts signals to all of the gas flow control cabinets informing them of which tools are requesting that gas flow be started or stopped. The data processor in each gas cabinet is programmed to receive these broadcasts on the digital input lines and compare the tool numbers with those it has stored. When it detects a match, it executes the instructions broadcast. Otherwise, it ignores the signals. Thus, gas distribution legs for which a given tool number has been stored will be enabled to start or stop gas flow.

3. Read Setpoint Signals. On command from the supervisory control computer 44, the setpoints for each selected cabinet are read and displayed on the screen of the computer.

4. Read Setpoint Ranges. On command from the supervisory controller, the setpoint ranges for the various flow control are read and displayed.

5. Read Configuration. On command from the supervisory control computer, the configuration of each gas flow control cabinet is displayed.

6. Direct Valve Control Messages. These messages comprise commands directly from the supervisory control computer to open or close specific valves in specific gas cabinets.

7. Execute Pre-defined Function. On command from the supervisory control computer, several automatic functions such as purge operations can be ordered and will be executed by a specific one of the flow control cabinets.

8. Get Cabinet Display Messages. Upon command from the supervisory control computer, the display 352 on the cabinet control panel 138 (FIG. 15) is transmitted to the screen of the supervisory control computer for display to the operator there.

9. Message Display. Pursuant to the operation of the supervisory control computer, the display 352 on any selected cabinet can be made to display whatever the operator of the supervisory control computer wishes. This feature is used, for example, when there is direct control of valves from the supervisory computer.

10. Alarm Acknowledge Messages. The operator at the supervisory control computer can acknowledge any alarm by operation of the computer. This is secondary to and supplements acknowledgement of the same alarm condition at the cabinet itself. Therefore, the control of the individual units and the supervisory control computer both operate to provide this function.

11. Abort Function Messages. These messages are sent from the supervisory computer to abort a function which is in process at one of the flow control cabinets.

12. Set-point Messages. On command from the supervisory control computer, setpoints can downloaded from any of the gas flow control cabinets to the supervisory control computer for display there.

DATA PACKET STRUCTURE

As noted above, the tool interface controller polls the various gas flow control units periodically at the rate of about four messages per second. In response to a polling signal each cabinet sends back to the TIC a data packet.

Figure 14:
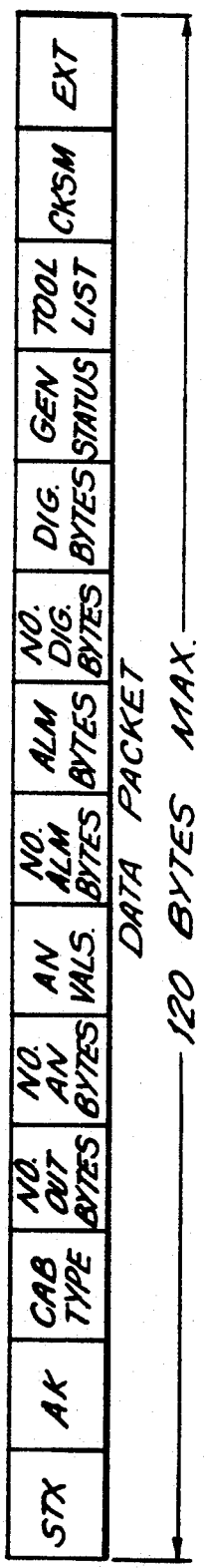
FIG. 14 is a schematic diagram of a data packet used in communications between the cabinets and the tool interface controller of FIG. 1.

FIG. 14 shows the arrangement of data in each data packet. Each packet is a maximum of 120 bytes in length. The data packet structure is as follows:

1. First is the start of text message ("STX") to identify the start of a packet.

2. Next is the acknowledge section ("AK").

3. Next is data indicating the type of cabinet which is responding. For example, there might be, in a single system, four or more different types of cabinets, some having only one distribution leg, some having four distribution legs, etc.

5. Next is a byte defining the number of analog values which are to follow.

6. Next are the analog values. Three bytes are used for each analog value.

7. Next is a byte giving the number of alarm status bytes to follow.

8. Next are the alarm status bytes (e.g. high flow, low flow, etc.).

9. Next is the number of digital input bytes to follow.

10. Next are the digital inputs.

11. Next is general status information, such as which manifold legs currently are enabled; which of the two gas sources A or B currently is being used, etc.

12. Next is the list of associated tool numbers for each distribution leg of the flow control units.

13. Next is a checksum.

14. Finally, End of text (ETX).

If reconfiguration is desired, this can be done in software in a simple manner. For example if the delivery association is to be changed; that is, if the tool number which is to be connected to a particular distribution leg is changed, the following procedure is followed.

The tool number is entered at the cabinet by the simple procedure described above. This is stored in an EEPROM so that a battery-backed memory is not necessary.

The next data packet now has the new tool number in it and the tool interface controller reads it and stores the number in its random access memory (RAM) 303. The cabinet now responds to the new tool number request during the broadcast of the calls for delivery of gas to the various tools.

Since the information from each gas cabinet stored in RAM 303 is refreshed once every several seconds, the RAM also need not be battery-backed, thus further reducing the cost and maintenance requirements of the gas distribution system.

SUPERVISORY CONTROL COMPUTER

As it was noted above, the supervisory control computer is a personal computer, such as an IBM PS/2 Model 80.

It should be noted again that the control that the supervisory control computer provides over each gas cabinet can be overridden by someone operating the controls at the gas cabinet itself. This is done in order to give preference to local control at the site over central control, whenever the controls compete with one another.

DISPLAYS AND PROMPTS

The supervisory control computer is programmed so as to provide the following displays on its screen:

Home Screen

Figure 17:
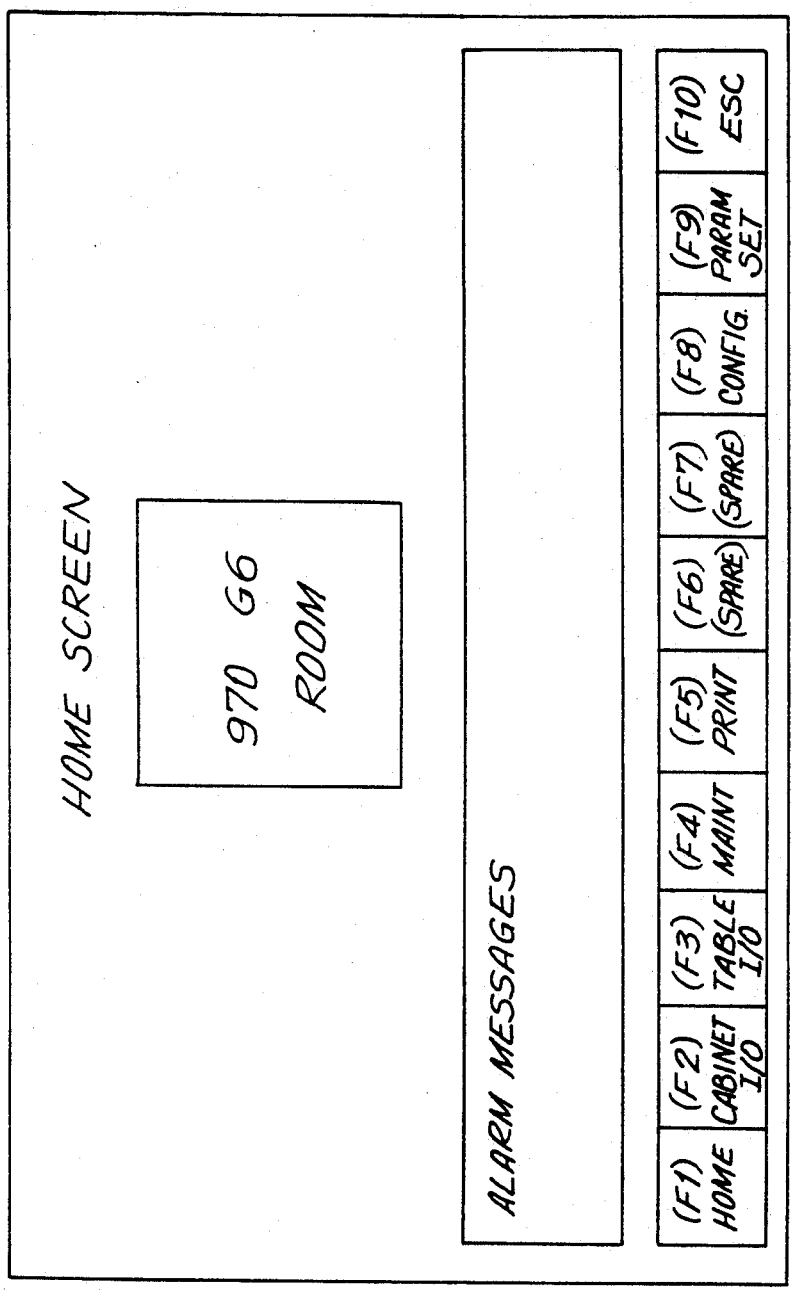

The operator can bring up the Home Screen shown in FIG. 17 by pressing the F1 key on the computer keyboard.

The screen shows, in graphic form, the status of the entire system. There is a separate block (e.g. "970 G6 Room") for each gas cabinets in the system. Only one room block is shown on the home screen above, whereas usually there will be several such rooms in a given system. The block is color-coded to indicate the status of the room: Red means one or more cabinets in the room has an active "high priority" alarm. Yellow means that one or more cabinets in the room has an active warning (low priority) alarm condition. Green indicates that all cabinets in the room are in a non-alarm state.

On the home screen, immediately below the room block or blocks is an area "Alarm Messages" where all current system alarms are shown. Two columns of four rows each are provided in this area. This allows for up to eight alarm messages to be displayed at one time. Additional messages can be displayed by using the down and up arrows on the computer keyboard to scroll down and up through the alarm messages.

The highest priority unacknowledged alarm appears in the upper left-hand position. The next highest priority alarm appears below it. This pattern continues by filling the first row and then the second row for unacknowledged alarms. Next, the acknowledged alarms follow in the list in the order of descending priority. The alarm text is color-coded. Unacknowledged alarms are printed in red text, whereas acknowledged alarms are in white.

Acknowledgement of the alarms can be made by simply pressing the "plus" key on the keyboard.

Room Layout Screen

By pressing the F2 key the operator can bring up the room layout screen shown in FIG. 18 which shows, in graphic form, the status of all cabinets in a particular room.

Each cabinet is given a number, and the layout of the cabinets on the screen the same as the cabinets have in the room. The blocks representing the cabinets are color-coded with either red, yellow or green color, following the code above, to indicate respectively, whether the cabinet has one or more active high-priority alarms; one or more active lower-priority alarms; or no active alarms at all.

Below the room layout is an area for alarm messages. Again, all active alarms are displayed in their descending priority, with the highest-priority unacknowledged alarm in the upper left hand position. The representation of a row of keys displayed at the bottom of the screen identifies the function keys that can be used to quickly move from one mode or screen to another.

Automatic Mode Screen

To select the automatic mode, while in the room layout mode, the operator presses the F2 key and the computer responds with a prompt asking for the desired cabinet number. When the cabinet number is typed in and the ENTER key is pressed, the system will bring up the screen shown in FiG. 19.

The various sections on the Automatic Mode screen are described below:

Quick keys - Along the left-hand side of the display is a block listing of the available quick keys. As discussed previously, these keys can be used to quickly move from one mode to another.

Cabinet Identifier - On the top left hand side of the display is a label identifying the chosen cabinet number and the type of gas it contains.

Menu/Prompt Area - Below the Cabinet identifier is a block used for menus, and other alphanumeric information, as appropriate.

Exhaust Flow Bar Chart - Below the Menu/Prompt area is a display giving the cabinet exhaust flow rate, in both a bar graph and numerically, in C.F.M.

Alarm Block - On the bottom left hand side of the display is an alarm block. Up to eight system alarms can be displayed in prioritized order on the screen. These alarms apply to all cabinets, not just the selected cabinet. If more than eight alarms are active, the arrow keys on the computer keyboard can be used to scroll through additional alarms.

Cabinet Manifold Graphic - The right hand side of the display provides a graphic representation of the cabinet manifold status. The lines and valves are color-coded to illustrate gas flow. An open valve and connected line are shown in green, while closed valves and tubing segments are shown in red.

Analog values of operating parameters are displayed at the appropriate positions in the manifold. These readings are primarily pressures measurements and cylinder weights. The association of the delivery legs with the tools is given above the piping diagram. As an example, in the screen shown, leg #1 is connected to tool #570, and leg #2 is connected to tool #314. In the example shown, only two legs are in use, either because that cabinet has only two legs, or because only two of the four legs are in use.

Selecting An Automatic Function

Selecting an automatic function is a simple process in which the operator follows the prompts in the Menu/Prompt area of the screen. In the Menu/Prompt area is a list of available automatic functions, along with the control function key that will select each. Additional functions may be made available on other pages by pressing the "Page Up" or "Page Down" keys on the keyboard.

To select a function, the operator presses the associated control key combination. For example, on the screen shown, pressing the Ctrl key and the F1 key simultaneously will display a prompt to enter the password. The password is typed and entered by pressing ENTER. If the correct password is entered, the Purge to Change Cylinder A function begins, unless an interlock condition exists which prevents operation.

When a function is selected, the supervisory control computer will communicate through the TIC to the cabinet. If everything is satisfactory (no interlocks) the function will start. If not, a message indicating that function operation is inhibited will be displayed for a brief period in the Menu/Prompt area.

During function operation, the Menu/Prompt area displays the same messages that are being displayed at the cabinet. During any automatic function, the operator can abort the function by pressing the ESC key on the computer keyboard.

Maintenance Mode

Figure 20:
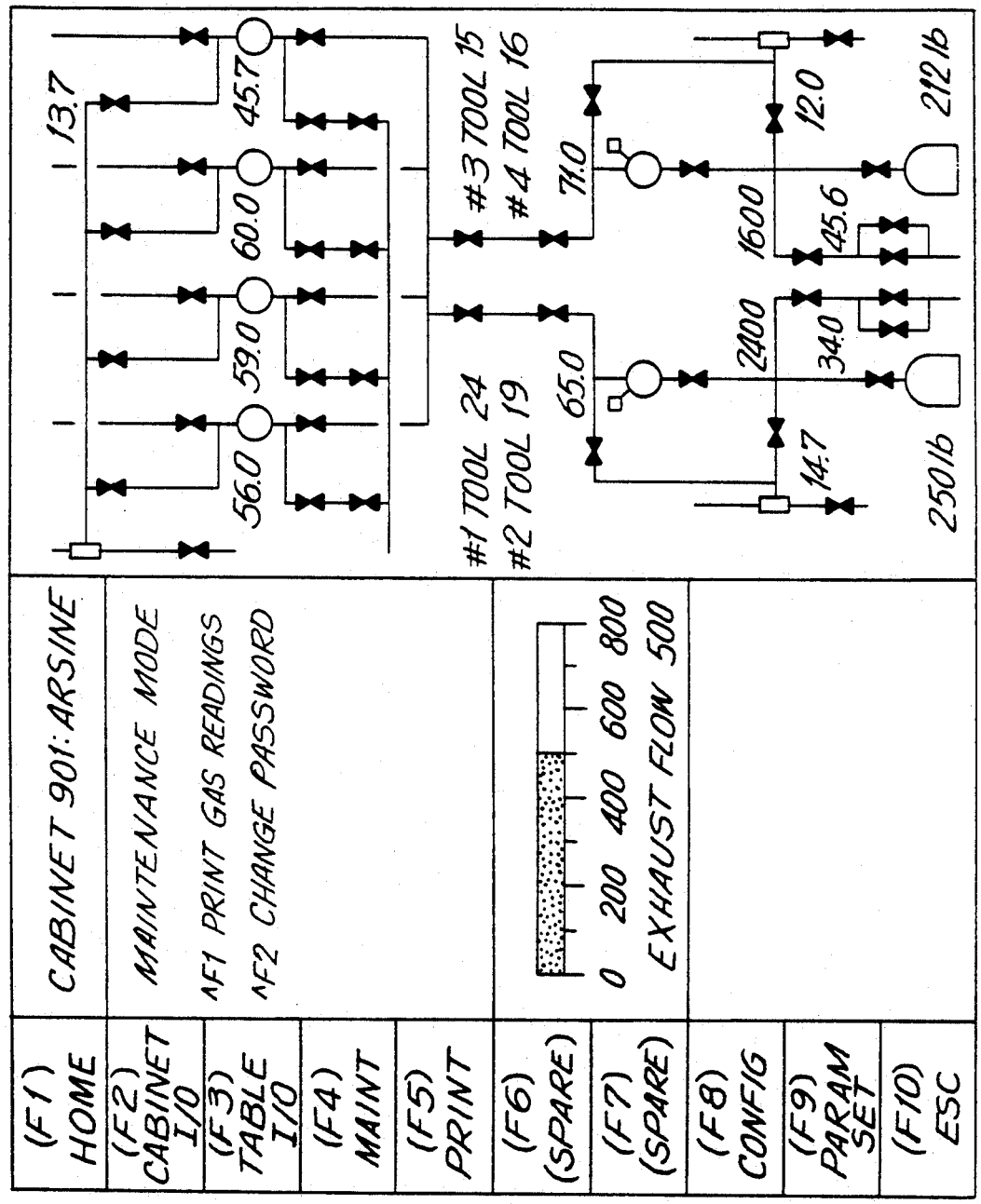

The screen shown in FIG. 20 shows the maintenance mode of operation.

This mode can be used to print system readings or to change the main system password. Its display is identical in configuration to the automatic mode display. This mode can be selected simply by selecting the F4 key to bring the screen up.

It may not be necessary to enter a particular cabinet identification number, since the maintenance mode display will display the characteristics of the last cabinet number which was previously selected in another mode.

The "Print Gas Readings" function, which is entered by pressing key F1 while in the maintenance mode, allows the operator to select a gas room and to get a printout of the current pressures and weights of cylinders used to supply gas to each tool. The room number is listed, followed by the date and time at the top of the printout.

The printout lists one row of data for each tool that is connected to a cabinet. Each row contains the tool name, tool number, cabinet number, gas type, the active cylinder, and pressure or weight reading. If scales are present, a weight reading is listed; otherwise, a pressure reading is listed.

From the Maintenance Mode Screen, to select the Print Gas Readings function, the operator presses Ctrl and F1 simultaneously. A prompt is displayed to enter the room number. When this is done, a message is displayed "Please wait until printing completes" while the document is being printed. After the printing completes, the previous menu appears with selections to Print Gas Readings and to Change Password.

The Change Password function allows the operator to change the main system password. This password is utilized to enter Configuration Mode, Parameter Set Mode, and the Exit to Dos mode. This password does not apply to activating automatic functions; automatic functions have a built-in password that cannot be changed.

From the Maintenance Mode Screen, to select Change Password, the operator presses Ctrl and F2 simultaneously. A prompt is displayed asking for the current password. The current password is typed in and entered by pressing the ENTER key. If an incorrect password is entered, a prompt appears "Try again" and the operator can enter the password again to continue or the operator can press ENTER to return to the menu selections.

If the correct password is entered, a prompt is displayed asking for the new password. The new password is typed and entered. Next, a prompt is displayed asking for the new password again. The same new password is typed again and entered. If the second new password matches the first, a message is displayed indicating that the password has been changed. If the second new password does not match the first, a message is displayed indicating that the password has not changed. In either case, the menu returns with the selections displayed for Print Gas Readings and Change Password.

Parameter Set Mode

The supervisory control computer allows an operator at a single supervisory station to review and/or modify setpoints in any cabinet in the system. This is accomplished through the Parameter Set Mode.

Cabinet Parameter Set Mode can be selected from any screen. To do so, the operator simply presses the F9 key, and, in response to a prompt, enters the main system password. The system enters the Parameter Set Mode with the graphics display for the most recently-selected cabinet.

Figure 21:
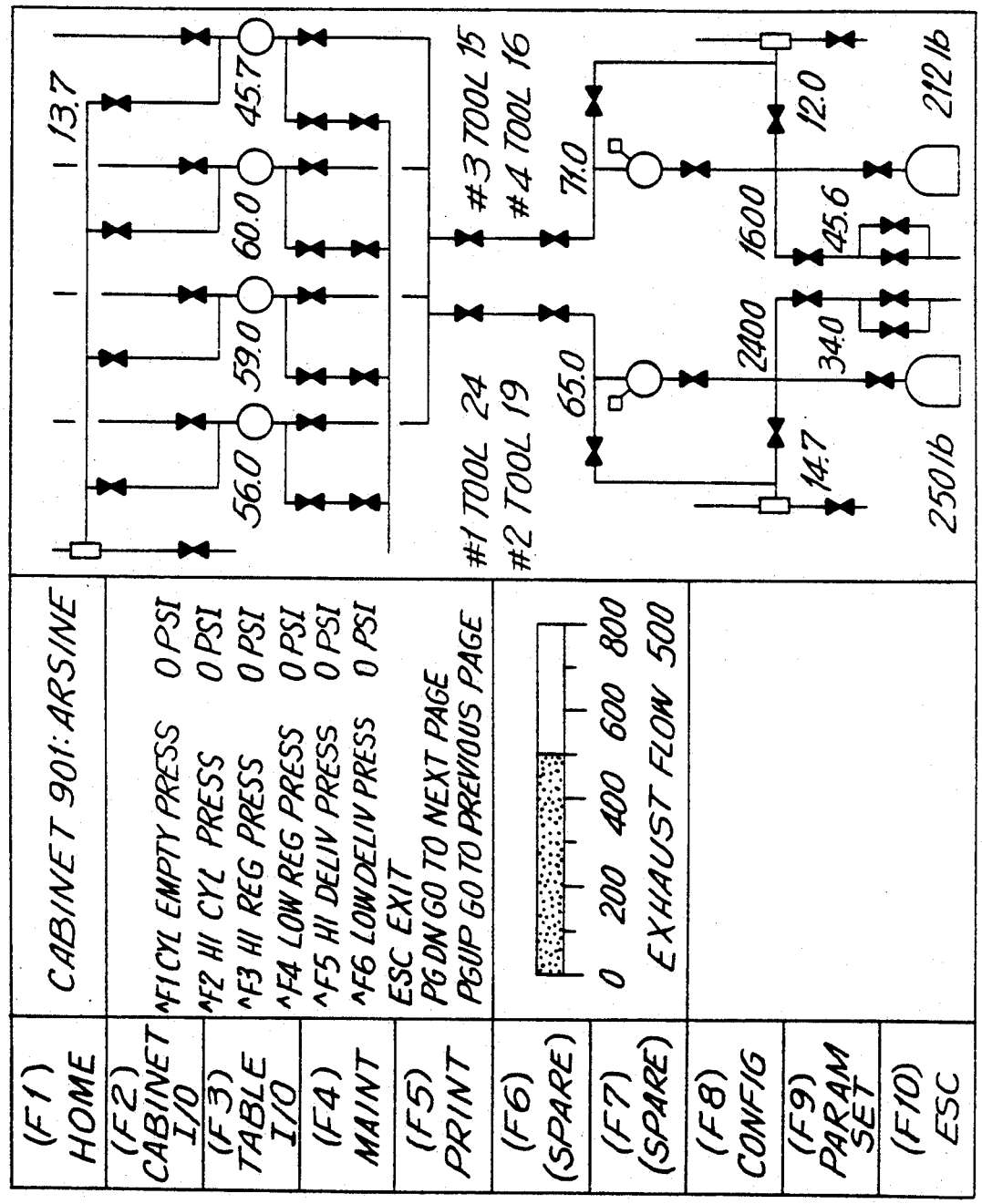

FIG. 21 is a reproduction of the Parameter Set screen.

Most of the information on the screen is of the same type as on previous screens and need not be explained further. Only THE new features will be explained.

All cabinet setpoints are stored in the gas cabinets themselves. In order to view and/or change setpoints, the supervisory control computer must first be used to retrieve these setpoints.

The first screen displayed upon entry into the Parameter Set mode is one which reads "F1 Remote Setpoints". The operator presses Ctrl and F1 to get a list of available cabinets, and selects the one desired.

Next, the operator presses the appropriate control and function key combination listed next to the cabinet number to command the supervisory control computer to retrieve setpoints from the desired cabinet. The Menu/Prompt area will display a list of cabinet setpoints along with their current values.

Changing A Setpoint

To change a setpoint, the operator presses the control key and function key associated with the setpoint. The display will project the current value of the setpoint along with the limits of adjustment. The operator types in the desired setpoint value and presses ENTER. When the new value is entered, it will be transmitted to the cabinet. If the cabinet accepts the setpoint, it sends back an acceptance message, which will be displayed in the Menu/Prompt area, indicating that the new setpoint has been stored. In not, a setpoint change failure message will be displayed.

Configuration Mode

The Configuration Mode is provided to allow a qualified operator to configure the supervisory control computer. It allows the following configuration functions to be performed.

Figure 22:
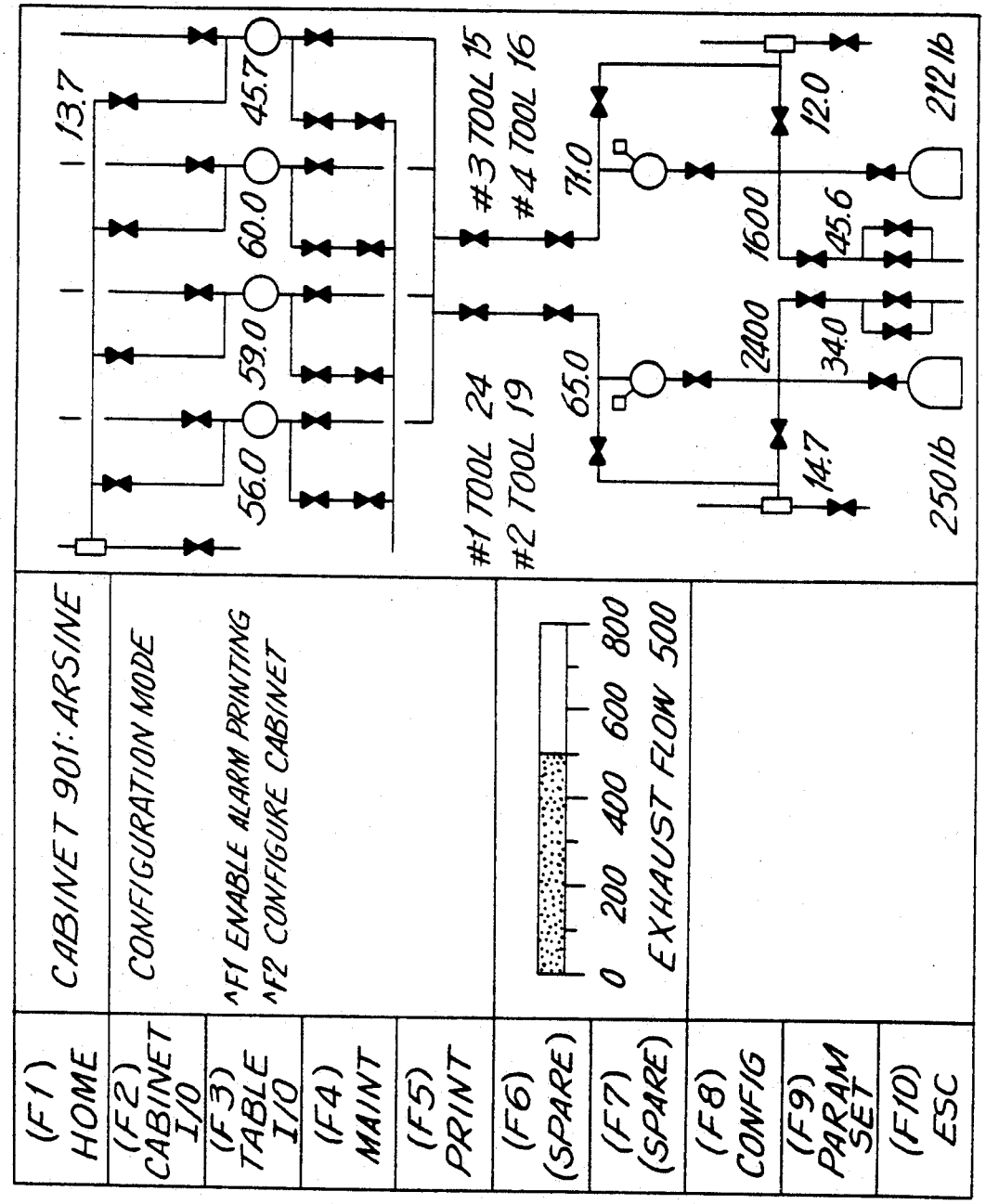

Set number of cabinets in the system
Enable/Disable alarm printing
Set the chemical gas name for each cabinet
Enable/Disable cabinets from being selected in any mode
Set the tool names that are displayed for each cabinet delivery leg
Set the tool numbers that are displayed for each delivery leg Configuration Mode can be selected from any supervisory system screen by pressing the F8 key. After entry of the password, the system enters the Configuration mode with the graphics displayed for the most recently selected cabinet. FIG. 22 shows the top-level Configuration Mode screen.

Following is an explanation of the functions which can be performed in this mode.

Set Number of Cabinets

In this iunction, the operator sets the number of cabinets that can be accessed by the operator at the supervisory control computer. This number is the total number of cabinets that are available for selection in any mode that requires a cabinet number to be entered.

To select this function, the operator presses Ctrl and F1. A prompt appears asking for the number of cabinets. The number of cabinets is typed in and entered.

Selectinq Enable/Disable Alarm Printing

In the Configuration Mode, whenever Ctrl and F2 are pressed, the alarm printing enable/disable selection toggles. For example, if the current state is disabled, the menu displays "Enable Alarm Printing." Making the selection Ctrl and F2 enables alarm printing and the display changes to "Disable Alarm Printing."

Configure Cabinet

Selection of Configure Cabinet allows the entry or modification of chemical gas names for a cabinet and tool names and tool numbers that are displayed on the manifold graphic associated with the delivery legs. Of course, this should be done to match changes which are made in the gas used or leg/tool connections at the cabinets. Also, a cabinet can be disabled or enabled from operator selection.

Selecting Configure Cabinet

Figure 23:
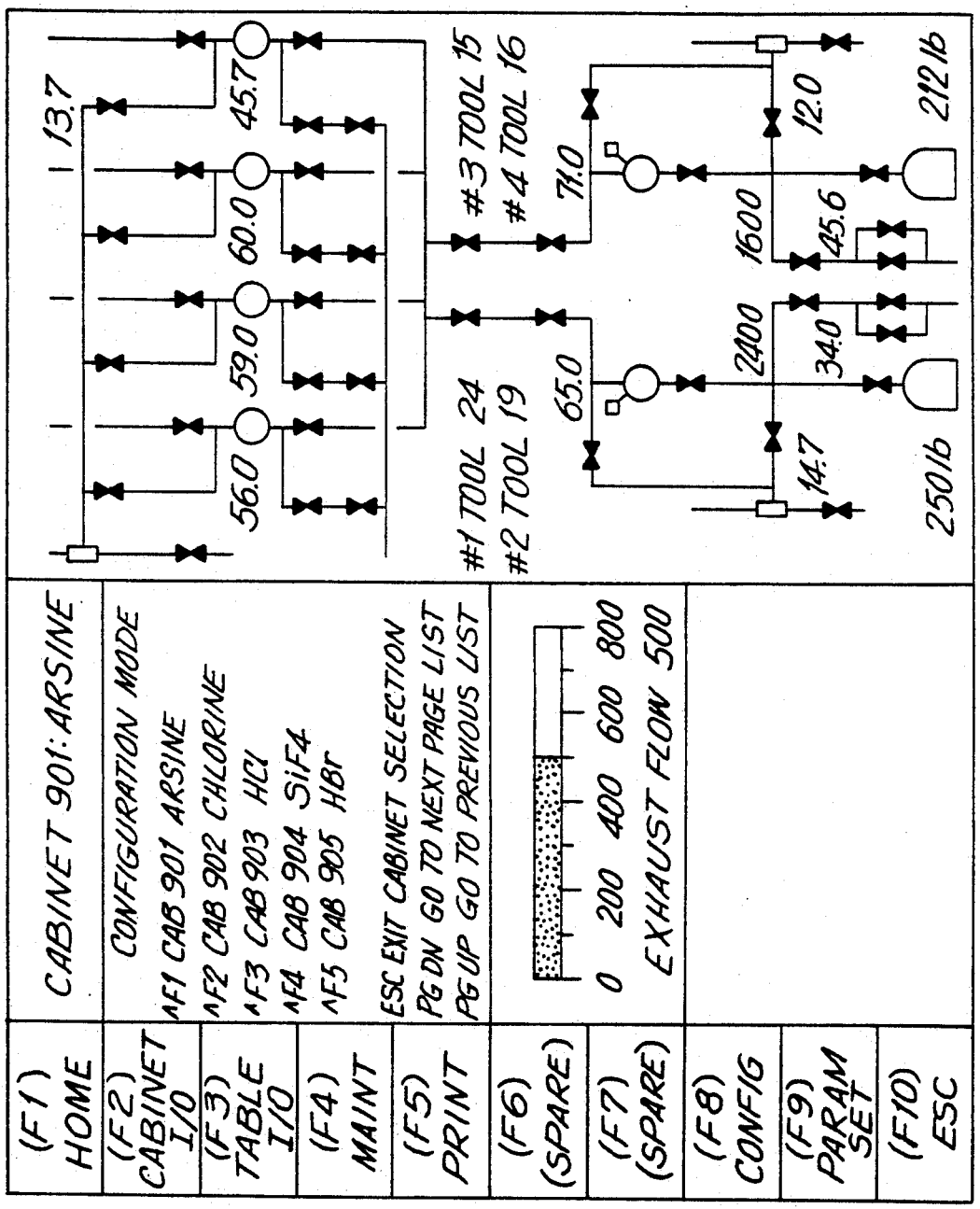

After entering Configuration Mode, to select the Configure Cabinet function, the operator presses Ctrl and F3 simultaneously. A menu of available cabinets appears in the Menu/Prompt area, as in the screen shown in FIG. 23.

Figure 24:
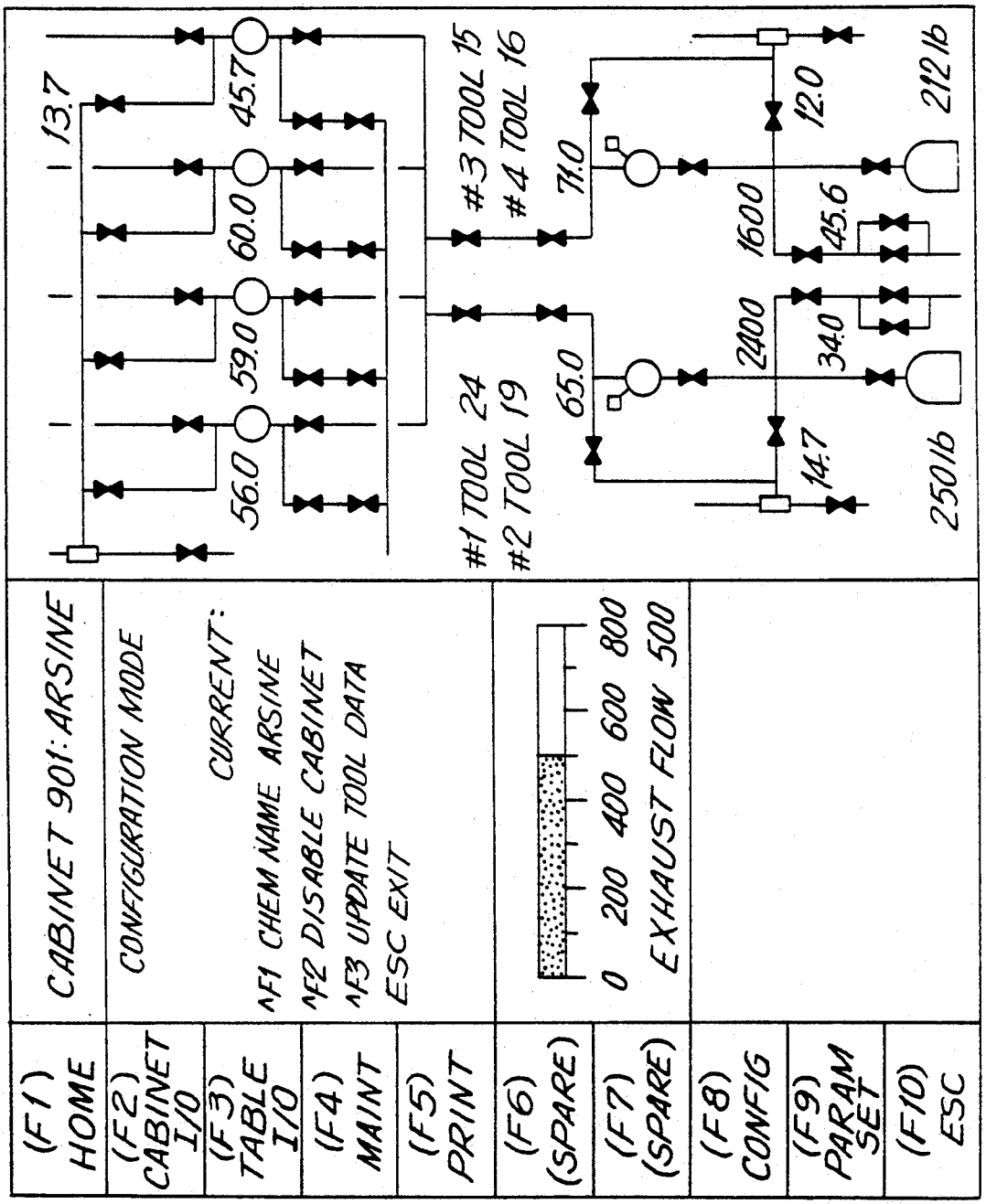

Next, the cabinet desired is selected. A menu appears with options to update the chemical name for a cabinet, disable cabinet from operator selection, or update tool data for a cabinet, as in the Configuration Mode Cabinet Definition List screen (FIG. 24).

Update Gas Name

This selection allows the operator to update the gas name used on various displays for a particular cabinet.

To update a gas name, after selecting Configure Cabinet, the operator presses Ctrl and F1. A prompt is displayed requesting entry of the gas name. The desired gas name is typed in and entered. The Configure Cabinet menu returns with the new gas name being displayed.

Disable Cabinet

This selection toggles between "Disable Cabinet" and "Enable Cabinet." If a cabinet is disabled, it will not be available for selection for any mode in the system except Configuration Mode. The screen will display "Disable Cabinet" if it is currently enabled.

To select Disable Cabinet, after selecting Configure Cabinet, the operator presses Ctrl and F2. Now the cabinet is disabled and the display now is "Enable Cabinet".

Update Tool Data

This selection allows the operator to update tool names and tool numbers for each delivery leg of a particular cabinet.

To update tool data, after selecting Configure Cabinet, the operator presses Ctrl and F3 and a new menu will appear displaying tool update selections for each delivery leg. To update the tool data for a delivery leg, the operator presses the associated control and function key combination. For example, he or she presses Ctrl and F3 to update tool data for Leg 3. A menu will appear with selections to Update Tool Name and Update Tool Hex Number.

To Update Tool Name, the operator presses Ctrl and F1 and a prompt will appear asking for the new tool name. The new name is typed in and entered. The menu will return with the options to Update Tool Name and to Update Tool Hex Number.

To Update Tool Hex Number, the operator presses Ctrl and F2 and a prompt will appear asking for the new tool hex number. The new hex number is typed in and entered.

Tabular I/O Screen

The Tabular I/O Screen is shown in FiG. 25.

The above screen provides a presentation of all cabinet inputs and outputs found for a particular cabinet. It provides basically the same information that is found in the cabinet graphics. However, there are data that are not displayed elsewhere.

This mode is used primarily for maintenance purposes. It provides maintenance personnel with detailed information of exactly what the gas cabinet is reading on its inputs and what the controller is putting out on the output lines. The inputs and outputs are color-coded. For the valve outputs, green indicates that the valve is open, while red indicates that the valve is closed. For the other outputs to the alarm bus, the color green indicates an energized, normal state, whereas red indicates an alarm state. For the inputs, the color green indicates that the input is active while red indicates that the input is not active.

Printing

Pressing key F5 will cause the printer of the control computer to print all the information on the current screen.

Exiting to Dos

Exiting to Dos terminates the supervisory program and allows the operator to use the computer for other purposes. To exit to Dos from any screen, the operator presses the F10 key and a prompt appears asking for the password. The main system password is entered, and the supervisor program will terminate, and the computer can be used for other purposes.

CONCLUSION

It can be seen from the foregoing that the present invention amply satisfies the objectives set forth above. It provides a gas flow control system which is capable of both local operation of each gas flow control unit, and central operation from a single personal computer by a single operator. This provides for simultaneous monitoring of the operation of each flow control unit, and of the system in its entirety.

Centralized control is provided with a minimum cost of cabling and wiring.

A highly versatile gas control unit is provided which supplies process gas to any one or all of four different tools at which the gas is utilized. Furthermore, the gas can be supplied from either of two alternative source tanks so as to minimize down-time and insure a continuous flow of process gas.

The system provides a high degree of operator safety, without the cost usually required in past systems. The cost of purging various flow lines in the control units is simplified and made faster by the provision of local purging techniques in the short sections of the gas distribution legs in the flow control units, rather than purging the entire length of the conduit from the flow control cabinets to the tool locations. This saves gas and time.

Purging of the delivery lines to the tools is made possible, even through flow-through purging is not available, thus improving safety in line maintenance operations.

Automatic selection of exhaust conduit size parameters allows the parameters, by means of a few simple keystrokes, to accommodate the gas flow control unit to be used with a variety of different sizes of exhaust conduits which may be installed in a given plant, thus increasing the versatility of the flow control equipment, as well as decreasing installation costs.

Considerable labor savings are created by the provision of automatic means to re-calibrate the zero readings of various pressure and weight transducers in the system. By utilizing a pressure source already available in the system, hardware costs are minimized. Moreover, the calibration is done without exposing the gas flow conduits to the contaminating atmosphere. The calibrations are performed quickly and easily by the operation of a few controls.

Changing the wiring connections between the tools and the gas cabinets does not require mechanical re-wiring. Instead, the connections are changed in software, by means of a few keystrokes.

The above description of the invention is intended to be illustrative and not limiting. Various changes or modifications in the embodiments described may occur to those skilled in the art and these can be made without departing from the spirit or scope of the invention.

We claim:

1. In or for a process gas distribution system, said system comprising, in combination, a plurality of gas distribution control units, each containing electrically-operated flow control means for controlling the flow of process gas to at least one utilization location, interface control means located remotely from said control units, communications means for communicating signals between said interface control means and said flow control means, and between said utiization locations and said interface control means, means for identifying each of said flow control means and each of said utilization locations, adn means for communicating signals to selected flow control means in response to signals from a specific one of said utilization locations.

2. A system as in claim 1 including supervisory control computer means connected to said terminal interface control means for communicating status information and control signals between said supervisory contro lcomputer means and each of said flow control means.

3. A system as in claim 2 in which said supervisory computer means includes means for monitoring and controlling the operation of each of said flow contro lmeans, and including means in each of said flwo control means enabling said flow control means to operate independently of said supervisory computer means.

4. A system as in claim 1 in which said interface control means includes means for broadcasting to said flow control means signals responsive to signals from one of said utilization locations, and selective response means for causing said flow control means to respond to the broadcasting signals selectively in accordance with stored data.

5. A system as in claim 1 in which said communications means includes cable means for connecting said interface control means to said flow control means sequentially, and in which said interface control means includes means for sequentially polling each of said flow control means to interrogate and receive signals from each of said flow control means.

6. A system as in claim 1 including process gas flow switching means at each utilization location for use in starting and stopping the flow of process gas to that location from one of said flow control means, said communications means including means connected between said interface control means and each of said switching means for communicating signals therebetween.

7. A system as in claim 6 including data processing terminal means at each of said utilization locations for gathering data at said location and transmitting it to said interface control means in response to polling.

8. A system as in claim 3 including means for causing the direct operation of each of said flow control means to override operational commands from said supervisory computer means.

9. A method for supervisory control at a single station of the operation of a plurality of gas flow control units, said control units being located apart from one another, said method comprising the steps of:

(a) providing a supervisory computer at said station;
(b) providing an interface unit at said station;
(c) communicating signals from a plurality of utilization stations through said interface unit to said flow control units to cause selective operation thereof;
(d) sequentially polling said gas flow control units to transmit to said computer data concerning the operation of said control units;
(e) sending control signals to said control units from said supervisory computer to control operation thereof; and (f) displaying on display means at said station information regarding the operation of said control units.

10. A method as in claim 9 including controlling the operation of each of said control units either at said supervisory computer, or at the control unit itself, while giving priority to control commands generated at the control unit itself.

11. In or for a process gas distribution system for distributing process gas to spaced-apart gas utilization stations under the control of spaced-apart gas flow control units, said system including communications means for electrically communicating signals between each of said stations and said gas flow control units for controlling the delivery of process gas to each of said stations, there being at least one gas delivery conduit controlled by each of said control units, the improvement of interface means for associating station signals from each gas utilization station with at least one of said gas flow control units to cause process gas to be delivered over a selected gas delivery conduit to that station, and storing means responsive to operator control for storing in memory and changing the association between said station signals and said gas delivery conduits.

12. Apparatus as in claim 11 including means for identifying the station from which said station signals come, memory means for storing a correlation between the station identification and at least one selected gas delivery conduit, and means for causing gas to be delivered from a source through said conduit to the identified station, said storing means comprising means for changing said correlation stored in said memory means.

13. Apparatus as in claim 11 in which said interface means includes means for broadcasting said station signals to a plurality of said gas flow control units, and each of said gas flow control units includes means for reading station-identifying signals transmitted to it, identifying the corresponding gas flow conduit, and causing gas to flow through that conduit.

14. Apparatus as in claim 12 in which said interface means includes a unit having first input/output means for communicating with a plurality of said stations, second input/output means for communicating with a plurality of said gas flow control units, and data processing means for broadcasting the identification of each station requesting initiation or termination of gas flow to said gas flow control units.

15. A method of changing the association of each a plurality of gas delivery conduits with each of a plurality of gas utilization stations to enable the change of electrical control to correspond to gas flow re-routing, said method comprising the steps of:
(a) connecting each of said stations for electrical communication with a terminal unit,
(b) identifying the signals received from said stations on the basis of which station the signals came from,
(c) storing in computer memory data associating specified ones of said gas delivery conduits with specified ones of said stations,
(d) providing electrical communications through said terminal unit between each of said stations and a selected one or more of a plurality of control units remote from said terminal unit, the selection being made on the basis of the stored association data,
(e) changing the connections of said gas delivery conduits to said stations, and
(f) erasing said data from memory and storing new data to provide new associations of stations and conduits corresponding to the gas conduit connection changes.

16. A method as in claim 15 in which said erasing and storing step is performed at each of the remote control units, and said data is periodically transmitted to memory in said terminal unit by polling.

17. A method as in claim 16 in which said data is stored in electrically-erasable programmable read-only memory in said remote control units, and the memory in said terminal unit is volatile random access memory.

* * * * *